(12) United States Patent
Natsume

(10) Patent No.: US 6,765,272 B2
(45) Date of Patent: Jul. 20, 2004

(54) SEMICONDUCTOR DEVICE

(75) Inventor: Hidetaka Natsume, Tokyo (JP)

(73) Assignee: NEC Electronics Corporation, Kanagawa (JP)

(*) Notice: Subject to any disclaimer, the term of this patent is extended or adjusted under 35 U.S.C. 154(b) by 0 days.

(21) Appl. No.: 10/131,206

(22) Filed: Apr. 25, 2002

(65) Prior Publication Data
US 2002/0158272 A1 Oct. 31, 2002

(30) Foreign Application Priority Data
Apr. 27, 2001 (JP) ........................................ 2001-131542

(51) Int. Cl.[7] .............................................. H01L 29/76
(52) U.S. Cl. .......................... 257/393; 257/66; 257/67; 257/69; 257/70; 257/903; 257/904
(58) Field of Search ............................ 257/66, 67, 69, 257/70, 204, 205, 206, 903, 904, 393; 438/128, 129, 149, 151, 152, 157, 166, 309

(56) References Cited

U.S. PATENT DOCUMENTS

| | | | | |
|---|---|---|---|---|
| 5,072,286 A | * | 12/1991 | Minami et al. | 257/208 |
| 5,404,030 A | * | 4/1995 | Kim et al. | 257/67 |
| 5,453,640 A | * | 9/1995 | Kinoshita | 257/520 |
| 5,612,552 A | * | 3/1997 | Owens | 257/202 |
| 5,670,395 A | * | 9/1997 | Pan | 438/451 |
| 6,031,267 A | * | 2/2000 | Lien | 257/344 |
| 6,175,138 B1 | | 1/2001 | Noda | |
| 6,271,542 B1 | * | 8/2001 | Emma et al. | 257/67 |
| 6,486,056 B2 | * | 11/2002 | Pasch et al. | 438/622 |
| 6,501,115 B2 | * | 12/2002 | Yoshida et al. | 257/296 |
| 6,534,864 B1 | | 3/2003 | Tanaka et al. | |

FOREIGN PATENT DOCUMENTS

| | | | | |
|---|---|---|---|---|
| JP | 05-006973 | * | 1/1993 | ............ 27/102 |
| JP | 5-90206 | | 4/1993 | |
| JP | 6-177067 | | 6/1994 | |
| JP | 2000-12705 | | 1/2000 | |
| JP | 2000-200838 | | 7/2000 | |
| JP | 2000-208436 | | 7/2000 | |
| KR | 2000-0029422 | | 5/2000 | |

* cited by examiner

Primary Examiner—Eddie Lee
Assistant Examiner—Quang Vu
(74) Attorney, Agent, or Firm—Foley & Lardner

(57) ABSTRACT

A semiconductor device has a gate electrode which is formed on a first conductive-type well set in semiconductor substrate, with a gate insulating film lying therebetween; a LDD structure in which, on either side of said gate electrode, there are formed a LDD region and a source/drain region; an interlayer insulating film to cover said gate electrode as well as said LDD regions; and contact sections. A contact section connecting to one side of the source/drain regions having a potential equal to a potential of said first conductive-type well is disposed so as to come into contact with the LDD region lying thereunder; and a contact section connecting to the other side of the source/drain region having a potential different from the potential of said first conductive-type well is disposed so as not to come into contact with the LDD region lying thereunder. The present invention can develop technology capable to reduce the memory cell area while suppressing the generation of the leakage, and provide a semiconductor memory device of high integration with excellent element characteristics having a low standby current.

14 Claims, 23 Drawing Sheets (b)

(a)

SEMICONDUCTOR DEVICE

TECHNICAL FIELD

The present invention relates to a semiconductor device and is applicable to a semiconductor device having a SRAM (Static Random Access Memory).

BACKGROUND OF THE INVENTION

With reference to drawings, the basic structure of a SRAM cell that is a semiconductor memory element is described below.

As shown in a circuit diagram of FIG. 1, a SRAM cell is composed of a flip-flop circuit that functions as an information storage section and a pair of transmission transistors $T_1$ and $T_2$ that control the conduction between data lines (bit lines, $BL_1$ and $BL_2$) which serve for writing and reading of the information and the flip-flop circuit. The flip-flop circuit is made of, for example, a pair of CMOS (Complementary Metal Oxide Semiconductor) inverters, and each CMOS inverter contains a driver transistor $D_1$ ($D_2$) and a load transistor $P_1$ ($P_2$).

One side of source/drain regions in each transmission transistor $T_1$ ($T_2$) is connected to drains of a load transistor $P_1$ ($P_2$) as well as a driver transistor $D_1$ ($D_2$), and the other side thereof is connected to a bit line $BL_1$ ($BL_2$). Further, gates of a pair of the transmission transistors $T_1$ and $T_2$ each form a part of a word line WL and are connected with each other.

The gates of the driver transistor $D_1$ and the load transistor $P_1$ which constitute one of the CMOS inverters are connected to the drains (the storage node $N_2$) of a driver transistor $D_2$ and a load transistor $P_2$ which constitute the other of the CMOS inverters. Further, the gates of the driver transistor $D_2$ and the load transistor $P_2$ which constitute the latter of the CMOS inverters are connected to the drains (the storage node $N_1$) of the driver transistor $D_1$ and the load transistor $P_1$ which constitute the former of the CMOS inverters. In effect, a pair of CMOS inverters are arranged such that the input/output section of each CMOS inverters may be cross-coupled with the gate of the other CMOS inverter through one of a pair of interconnections $L_1$ and $L_2$, which are called the local interconnections.

Further, a reference voltage ($V_{ss}$, for example, GND) is applied to the source region of each one of the driver transistors $D_1$ and $D_2$, and a supply voltage ($V_{cc}$) is applied to the source region of each one of the load transistors $P_1$ and $P_2$.

FIG. 2 is a diagram showing the ordinal layout of a conventional SRAM cell which corresponds to the circuit diagram of FIG. 1.

In the drawing, AR indicates an active region, in which a dopant diffusion region to constitute one of the transistors is formed. Further, an area shown by a chain line in the drawing is a region for one memory cell, and a number of memory cells are arranged side by side along the direction of the length of the word line to form an array, and arrays of memory cells are regularly disposed in the direction perpendicular to this direction of the length.

Referential numerals 117 and 118 indicate contact sections for the bit line $BL_1$ and the bit line $BL_2$, respectively; 121 and 122, contact sections for the supply voltage line; 123 and 124, contact sections for the reference voltage line (ground line). Contact sections 116, 111 and 113 are connected to one another through a local interconnection $L_1$ which is not shown in the drawing, while contact sections 115, 112 and 114 are connected to one another through a local interconnection $L_2$ which is neither shown in the drawing. The transmission transistor $T_1$ is composed of a portion of the word line WL lying between the contact sections 113 and 117 and diffusion regions lying on both side thereof, and the transmission transistor $T_2$, a portion of the word line WL lying between the contact sections 114 and 118 and diffusion regions lying on both sides thereof. The driver transistor $D_1$ is composed of a portion of an interconnection 131 lying between the contact sections 113 and 123 and diffusion regions lying on both sides thereof, and the driver transistor $D_2$, a portion of an interconnection 132 lying between the contact sections 114 and 124 and diffusion regions lying on both sides thereof. The load transistor $P_1$ is composed of a portion of the interconnection 131 lying between the contact sections 111 and 121 and diffusion regions lying on both sides thereof, and the load transistor $P_2$, a portion of the interconnection 132 lying between the contact sections 112 and 122 and diffusion regions lying on both sides thereof.

The SRAM cell described above has excellent element characteristics such as the high noise tolerance and the small stand-by power. Further, for the SRAM cell of this sort, in view of element characteristics, selection of the materials and layout are carefully made so as not to lose symmetry of the element structure (in other words, to prevent imbalance from occurring) within the limits of possibility,.

However, such a SRAM cell has a problem that a cell area tends to become considerably large, due to requirements to have 6 transistors in one memory cell and isolate p-type MOSFETs from n-type MOSFETs within one and the same cell as well as the need of numerous interconnections.

Accordingly, for a semiconductor memory device having a SRAM of this sort, an improvement in the integration level is one of the prime issues. Even if a reduction made in one memory cell is small, the degree of integration can be greatly raised, as a whole, in a semiconductor memory device of high integration. It is, therefore, important to make the area of the memory cell as small as possible. For that purpose, accompanying the recent progress in manufacturing technology, great efforts have been made to achieve, in addition to miniaturization of fabrication size and improvement of layout design, further reduction of the spacing of the interconnections as well as the distance between the interconnection and the contact section.

However, when the distance between the gate electrode of the transistor and the contact section disposed on the dopant diffusion region becomes excessively small, a problem of the leakage arises. This phenomenon occurs notably in the p-type MOSFETs which constitute the load transistors $P_1$ and $P_2$, and the standby current in the memory cell may increase, owing to the leakage generation. Such a phenomenon causes a serious problem, particularly in the Low Power type SRAM.

The generation of the leakage becomes marked, if the contact section for the source/drain region is in contact with the LDD (Lightly Doped Drain) region. One of the reasons for that is considered to be the movement of the dopants in the LDD region, being drawn to the side of the contact section. Since the dopant concentration in the LDD region is lower than that in the source/drain region which is a dopant diffusion layer of high concentration, the LDD region is readily affected by the dopants drawn thereto, with its dopant concentration being easily changed, and this may lead to a failure to form the junction as prescribed.

Further, the reason why the leakage is notable in the p-type MOSFETs is thought to lie in a fact that boron used as p-type dopants is liable to be drawn heavily to the contact section. Especially when a titanium-based metal film is employed as a barrier film to constitute the contact section, the leakage becomes marked. The explanation is considered to be made as follows. Due to the effects of a heat treatment conducted in fabrication, a titanium silicide layer is formed on a contact interface between the titanium-based metal film and the silicon substrate, and it is chiefly this titanium silicide layer that draws boron thereat.

Meanwhile, for the purpose of lowering the sheet resistance and the contact resistance caused by the contact section, a refractory metal silicide layer may be set over dopant diffusion regions which constitute source/drain regions. In Japanese Patent Application Laid-open No. 177067/1994, there is described a problem that, in such a structure, especially in a structure wherein a titanium silicide layer is formed over the dopant diffusion layer into which boron ions are implanted as dopants ions, some of the boron in the dopant diffusion layer may be drawn into the titanium silicide layer to form a low concentration layer therein. Against this, another dopant ion implantation is, in that publication, carried out to complement the very amount of a decrease in dopant concentration in the low concentration layer, and thereby non-ohmic characteristics are suppressed and the parasitic resistance is prevented from increasing.

However, for the LDD region where the dopant concentration is low and a shallow junction is formed, it is difficult to estimate, beforehand, the amount of the decrease in dopant concentration and complement that amount accurately by performing another ion implantation. Further, in forming such a LDD region, it is also difficult to set, accurately, the dopant concentration to be higher than the original one by the amount enough to compensate the subsequent decrease in concentration. Moreover, as described in the above publication, because the low concentration layer formed by the drawing movement of dopants is limited in the vicinity of the contact interface, the junction section may maintain a high dopant concentration and, as a result, a LDD region having a concentration profile of this sort may be produced. In this instance, original functions of the LDD structure are hard to be fulfilled so that deterioration of element characteristics may be brought about.

SUMMARY OF THE INVENTION

An object of the present invention is to develop technology capable to reduce the memory cell area while suppressing the generation of the leakage and to provide a semiconductor memory device of high integration with excellent element characteristics.

The present invention relates to a semiconductor device having:
- a gate electrode which is formed on a first conductive-type well set in semiconductor substrate, with a gate insulating film lying therebetween;
- a LDD structure in which, on either side of said gate electrode, there are formed a LDD region which is a second conductive-type dopant diffusion region with a low dopant concentration and a source/drain region which is a second conductive-type dopant diffusion region with a high dopant concentration;
- an interlayer insulating film to cover said gate electrode as well as said section of LDD structure; and
- contact sections which are formed by filling up openings made in said interlayer insulating film with a conductive metal; wherein:
  - a contact section connecting to one side of the source/drain regions having a potential equal to a potential of said first conductive-type well is disposed so as to come into contact with the LDD region lying on this side of the source/drain regions; and
  - a contact section connecting to the other side of the source/drain regions having a potential different from the potential of said first conductive-type well is disposed so as not to come into contact with the LDD region lying on this side of the source/drain regions.

Further, the present invention relates to a semiconductor device having a SRAM in which a memory cell comprises a pair of transmission transistors and a flip-flop circuit containing a pair of driver transistors and a pair of load transistors; wherein:
  each one of said load transistors has:
   a gate electrode formed on a semiconductor substrate, with a gate insulating film lying therebetween; and
   a LDD structure in which, on either side of said gate electrode, there are formed a LDD region which is a dopant diffusion region with a low dopant concentration and a source/drain region which is a dopant diffusion region with a high dopant concentration; and, therein,
  a contact section connecting to the source region is disposed so as to make a distance therefrom to the gate electrode in the direction of the gate length smaller than a width of the LDD region lying between the gate electrode and the source region in the direction of the gate length; and
  a contact section connecting to the drain region is disposed so as not to come into contact with the LDD region lying on the side of the drain region.

Further, the present invention relates to a semiconductor device having a SRAM in which a memory cell comprises a pair of transmission transistors and a flip-flop circuit containing a pair of driver transistors and a pair of load transistors; wherein:
  every one of said load transistors and said driver transistors has:
   a gate electrode formed on a semiconductor substrate, with a gate insulating film lying therebetween; and
   a LDD structure in which, on either side of said gate electrode, there are formed a LDD region which is a dopant diffusion region with a low dopant concentration and a source/drain region which is a dopant diffusion region with a high dopant concentration; and, therein,
  a contact section connecting to the source region is disposed so as to make a distance therefrom to the gate electrode in the direction of the gate length smaller than a width of the LDD region lying between the gate electrode and the source region in the direction of the gate length; and
  a contact section connecting to the drain region is disposed so as not to come into contact with the LDD region lying on the side of the drain region.

Further, the present invention relates to the semiconductor device as set forth above, wherein each one of said transmission transistors has:
  a gate electrode formed on a semiconductor substrate, with a gate insulating film lying therebetween; and
  a LDD structure in which, on either side of said gate electrode, there are formed a LDD region which is a dopant diffusion region with a low dopant concentration and a source/drain region which is a dopant diffusion region with a high dopant concentration; and, therein, a contact section connecting to the source/drain region is disposed so as not to come into contact with the LDD region lying on the side of the source/drain region.

Further, the present invention relates to the semiconductor device as set forth above, wherein, at least, a bottom section of each contact section is composed of titanium or a titanium-containing material.

Further, the present invention relates to the semiconductor device as set forth above, wherein the dopant diffusion regions of said load transistors contain boron.

Further, the present invention relates to the semiconductor device as set forth above, wherein a refractory metal silicide layer is formed over a surface of every source/drain region in said load transistors, driver transistors and transmission transistors.

Further, the present invention relates to the semiconductor device as set forth above, wherein:

a contact section connecting to a drain region of a first load transistor which is one of said pair of load transistors and a contact section connecting to a drain region of a first driver transistor which has a gate electrode formed from a first conductive film interconnection A, the gate electrode being in common to said first load transistor, are formed, as one body, to constitute an inlaid interconnection set in a first insulating film which is an interlayer insulating film, and said inlaid interconnection serves as one of a pair of local interconnections cross-coupling a pair of input/output terminals in said flip-flop circuit; and a second conductive film interconnection formed from a second conductive film which is set on said first insulating film, with a second insulating film lying therebetween, constitutes the other one of said pair of local interconnections.

Further, the present invention relates to the semiconductor device as set forth above, wherein said second conductive film interconnection is disposed so as to overlap at least a portion of a top surface of said inlaid interconnection, with said second insulating film lying therebetween; and said inlaid interconnection and said second conductive film interconnection, separated by said second insulating film, constitute a capacitor element.

Further, the present invention relates to the semiconductor device as set forth above, wherein said inlaid interconnection is disposed so as to make connection with said drain region of the first driver transistor which is one of said pair of driver transistors;

said drain region of the first load transistor which is one of said pair of load transistors; and a first conductive film interconnection B which constitutes a gate electrode of a second driver transistor which is the other one of the pair of driver transistors as well as a gate electrode of a second load transistor which is the other one of the pair of load transistors, and said second conductive film interconnection is connected with a contact section connecting to said first conductive film interconnection A which constitutes said gate electrode of the first driver transistor and the first load transistor;

a contact section connecting to a drain region of said second driver transistor; and a contact section connecting to a drain region of said second load transistor.

The present invention can develop technology capable to reduce the memory cell area while suppressing the generation of the leakage, and provide a semiconductor memory device of high integration with excellent element characteristics having a low standby current.

DETAILED DESCRIPTION OF THE EMBODIMENTS

One of the main features of the present invention is its specific layout structure respecting the spacing between the gate electrode and the contact section connecting to the source/drain region in the direction of the gate length, for the MOS type field effect transistor (MOSFET) with the LDD structure. A MOSFET having a layout structure of this sort is well suited for a transistor to constitute a semiconductor device of high integration, a SRAM included.

As preferred embodiments of the present invention, examples in which the present invention is applied to a SRAM are described below.

Figure 1:
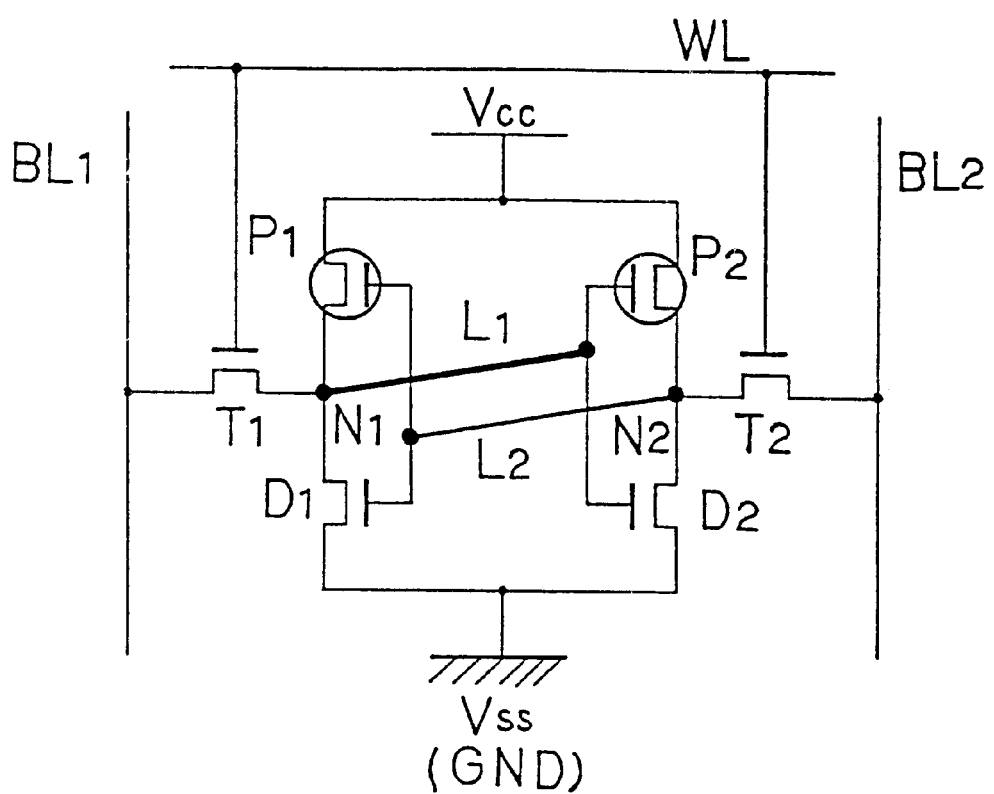
FIG. 1 is a circuit diagram of a SRAM cell to which the present invention is applied.

As shown in FIG. 1 described above, a memory cell in a SRAM of the present embodiment, composed of a pair of driver transistors $D_1$ and $D_2$, a pair of load transistors $P_1$ and $P_2$, and a pair of transmission transistors $T_1$ and $T_2$, is disposed in an intersection region of a word line WL and a pair of bit lines $BL_1$ and $BL_2$. A pair of driver transistors $D_1$ and $D_2$ as well as a pair of transmission transistors $T_1$ and $T_2$ consist of n-channel type ones, while a pair of load transistors $P_1$ and $P_2$ consist of p-channel type ones.

A pair of driver transistors $D_1$ and $D_2$ and a pair of load transistors $P_1$ and $P_2$ make up a flip-flop circuit that functions as an information storage section for memorizing 1 bit information. This flip-flop circuit is composed of a pair of CMOS inverters, and each CMOS inverter contains a driver transistor $D_1$ ($D_2$) and a load transistor $P_1$ ($P_2$).

One side of source/drain regions in each transmission transistor $T_1$ ($T_2$) is connected to drains of the load transistor $P_1$ ($P_2$) as well as the driver transistor $D_1$ ($D_2$), and the other side thereof is connected to a bit line $BL_1$ ($BL_2$). Further, gates of a pair of transmission transistors $T_1$ and $T_2$ each form a part of a word line WL and are connected with each other.

The gates of the driver transistor $D_1$ and the load transistor $P_1$ which constitute one of the CMOS inverters are connected to the drains (the storage node $N_2$) of the driver transistor $D_2$ and the load transistor $P_2$ which constitute the other of the CMOS inverters. Further, the gates of the driver transistor $D_2$ and the load transistor $P_2$ which constitute the latter of the CMOS inverters are connected to the drains (the storage node $N_1$) of the driver transistor $D_1$ and the load transistor $P_1$ which constitute the former of the CMOS inverters. In effect, a pair of CMOS inverters are arranged such that the input/output section (the storage node) of each CMOS inverter may be cross-coupled with the gate of the other CMOS inverter through one of a pair of interconnections $L_1$ and $L_2$, which are called the local interconnections.

Further, a reference voltage ($V_{ss}$, for example, GND) is applied to the source region of each one of the driver transistors $D_1$ and $D_2$, and a supply voltage ($V_{cc}$) is applied to the source region of each one of the load transistors $P_1$ and $P_2$.

Next, referring to FIG. 3 and FIG. 4, there is described below one embodiment of a specific layout structure, respecting the spacing between the gate electrode and the contact section connecting to the source/drain region in the direction of the gate length, for a MOSFET with the LDD structure.

Figure 2:
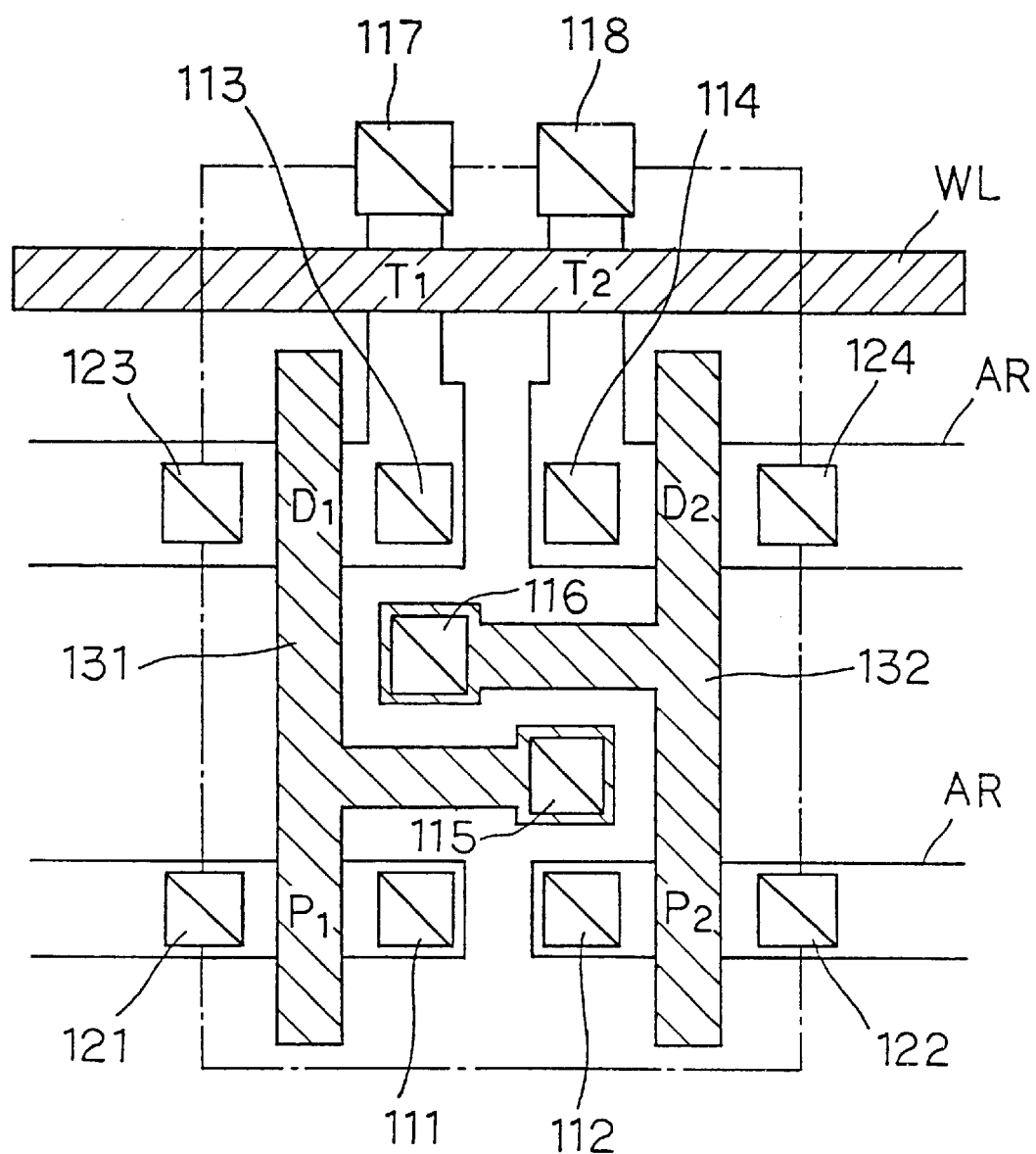
FIG. 2 is a diagram showing a layout of a conventional SRAM cell.
Figure 3:
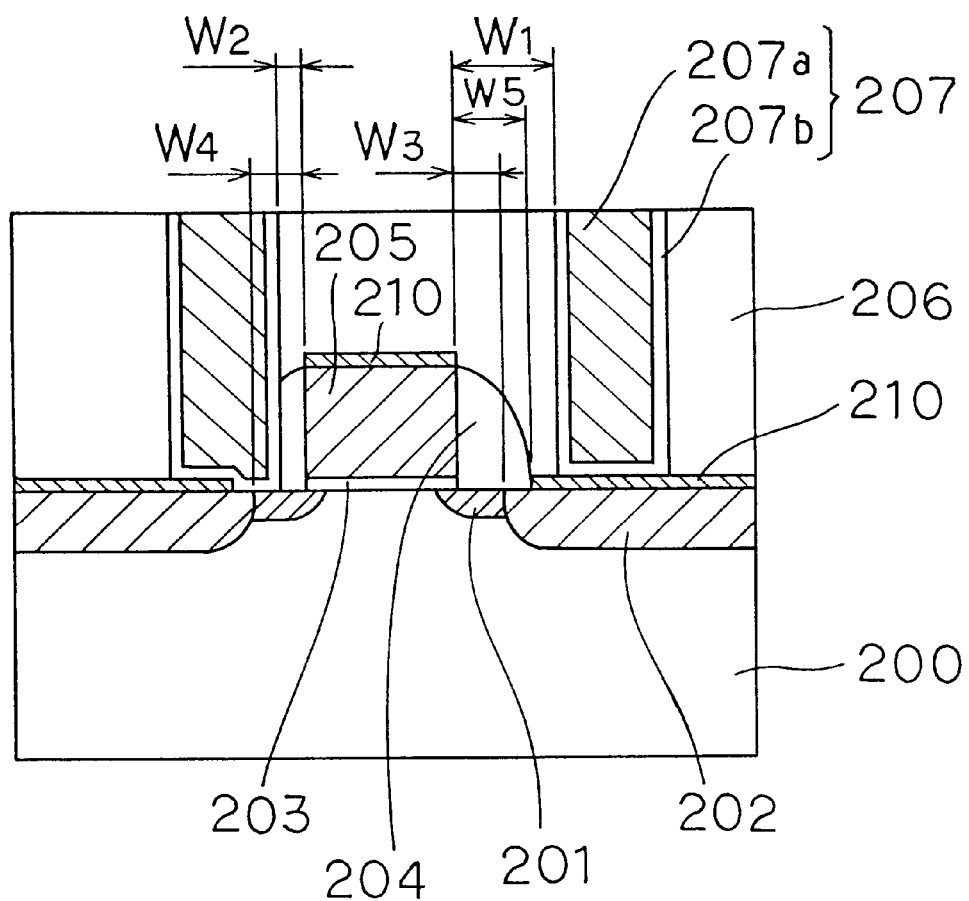
FIG. 3 is a schematic cross-sectional view of a transistor which constitutes a SRAM cell of the present invention.
Figure 4:
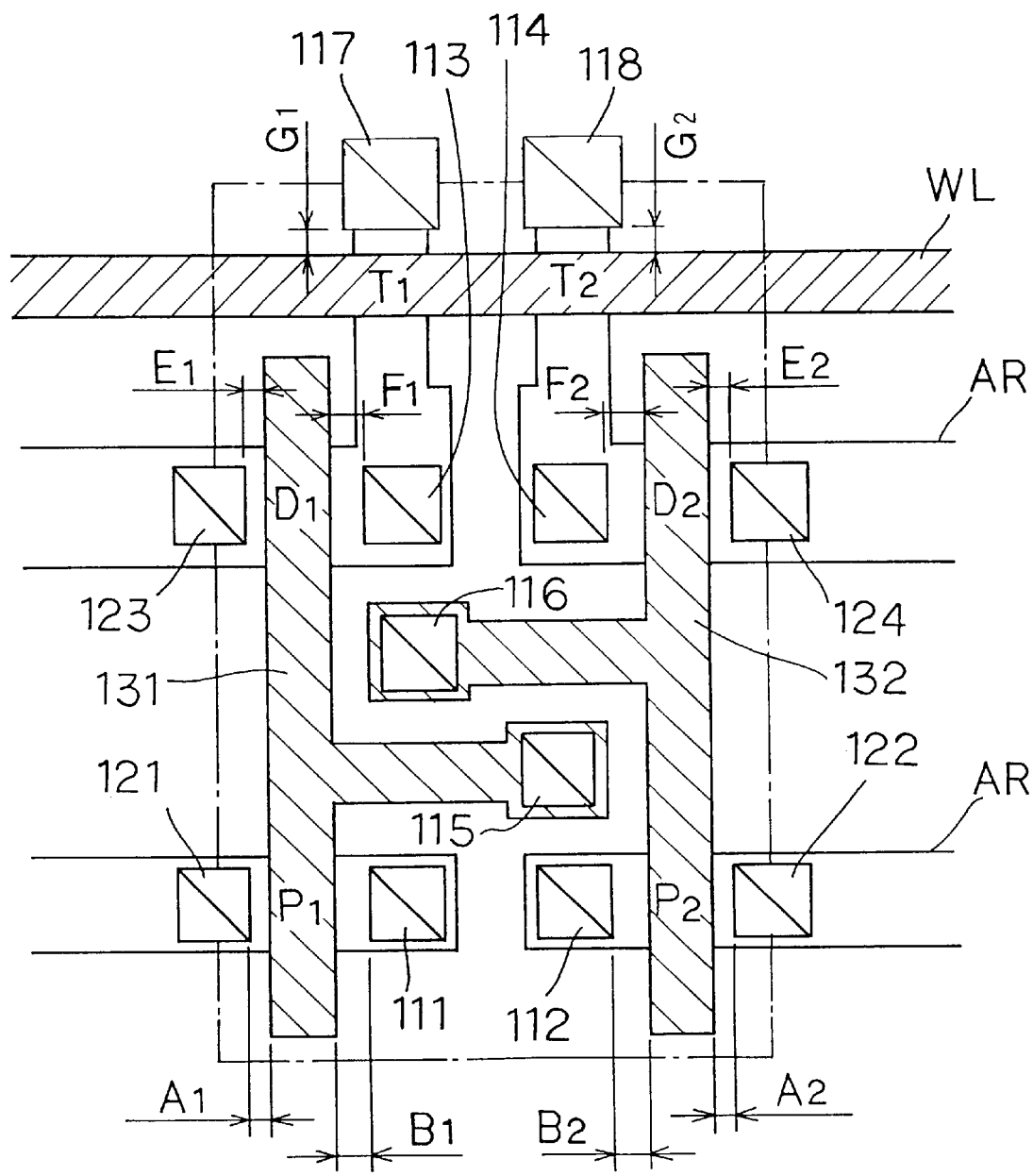
FIG. 4 is a diagram showing a layout of a SRAM cell according to the present invention.

FIG. 3 is a schematic cross-sectional view showing the structure of a driver transistor or a load transistor which constitutes a SRAM cell of the present embodiment, and FIG. 4 is a diagram showing a layout of the SRAM cell. To indicate parts corresponding to those in FIG. 2 described above, the identical numerals are utilized in FIG. 4.

Here, a gate electrode 205 is formed over an active region of a silicon semiconductor substrate 200, which is isolated by an element isolation insulating film (omitted from the drawing), with a gate insulating film 203 lying therebetween, and sidewall films 204 are formed on both sides of the gate electrode 205.

Further, on either side of the gate electrode 205, there are formed, within the semiconductor substrate, a LDD region 201 and a source/drain region 202, which are dopant diffusion regions containing dopants at a low concentration and a high concentration, respectively, whereby a LDD structure is set. Dopants employed as p-type ones are boron, and dopants for n-type ones may be phosphorus or arsenic. The doses of the dopants in the source/drain regions and the LDD region may be set to be $1 \times 10^{15}$ to $8 \times 10^{15}$ atoms/cm$^2$ and $1 \times 10^{13}$ to $2 \times 10^{14}$ atoms/cm$^2$, respectively. In particular, the dose of the dopants in the LDD region is preferably set in the above range, from the viewpoint of suppressing an increase in off-state current which may be brought about by an increase in electric field on the junction interface of the dopant diffusion region. Further, the junction depth of the source/drain regions may be set to be 0.1 to 0.2 μm. The junction depth of the LDD region in the n-type MOSFET and p-type MOSFET may be set to be 0.02 to 0.05 μm and 0.03 to 0.06 μm, respectively.

The gate length of the gate electrode may be set to be 0.18 to 0.20 μm and the width W5 of the sidewall insulating film 204 (the length in the direction of the gate length), 0.09 to 0.13 μm. When the width W5 of the sidewall insulating film is excessively narrow, the LDD region becomes small in its manufacture and the controlling effect the LDD structure has on electric field may be weakened. On the other hand, when the width W5 of the sidewall insulating film is too large, the LDD region becomes considerably long and its resistance, high, which may cause deterioration of transistor characteristics. With a structure described above, basic formation of the MOSFET is accomplished.

Further, in the foregoing MOSFET, for the sake of reducing the amount of the resistance, there are formed refractory metal silicide layers 210 on the source/drain regions 202 as well as the gate electrode 205. For these refractory metal silicide layers, titanium silicide layers and cobalt silicide layers can be utilized, but cobalt silicide layers are more preferable, considering the resistances of these silicide layers and the tendencies thereof to draw boron out. Hereat, in the case that a cap insulating layer is set on the gate electrode, the refractory silicide layer 210 should not be formed on this cap insulating layer.

The foregoing MOSFET may be manufactured, for example, in the following way.

First, on a silicon semiconductor substrate, an element isolation insulating film is formed by the trench isolation method, and on the active regions where this element isolation insulating film is not formed, a gate insulating film and a gate electrode are formed.

Next, by carrying out dopant ion implantation with a low dose, low concentration dopant layers are formed and, then, after forming an insulating film, etch back is applied thereto to form sidewall insulating films on both lateral sections of the gate electrode. Next, by carrying out dopant ion implantation with a high dose, high concentration dopant layers are formed and thereafter a heat treatment is conducted to activate the low concentration dopant layers and the high concentration dopant layers, which forms LDD regions and source/drain regions.

Next, after a refractory metal film of Co or the like is formed on the silicon semiconductor substrate by the sputtering method, a heat treatment is applied thereto to make silicon and the refractory metal film react each other, and thereby refractory metal silicide films are formed on the gate electrode and source/drain regions. The unreacted refractory metal film is removed by means of wet etching.

Subsequently, on the MOSFET fabricated as described above, an interlayer insulating film 206 is formed, and then contact sections 207 each of which is brought into contact with the refractory metal silicide layer 210 laid on the source/drain region 202 are formed, as shown in FIG. 3. A contact section 207 is formed in the following way. First, a contact hole is formed within the interlayer insulating film 206 so as to reach the refractory metal silicide layer 210 laid on the source/drain region 202. After a barrier film 207b is then formed from a titanium-containing material such as titanium, titanium nitride or the like on the inside of this contact hole, the hole is filled up with a conductive material (a buried conductive section 207a) such as aluminium, tungsten or the like and thereby a contact section is formed. For the barrier film 207b, it is preferable to utilize a layered film for which a titanium film and a titanium nitride film are laid in this order. In this layered film, the titanium nitride film is set mainly for enhancing the capability of the layered film to act as a barrier, and the titanium film, mainly for lowering the contact resistance thereof. Further, it is also possible to form the contact section by filling up the inside of the contact hole with a titanium-containing material.

One of the key points for the structure of a semiconductor device of the present invention is the layout in which the contact section connecting to one side of the source/drain regions having a potential different from the first conductive-type well on which the structure is formed is disposed so as not to come into contact with the LDD region lying on the side of this source/drain region. Such a layout can protect element characteristics from deterioration, including the leakage generation which may happen if the contact section comes into contact with the LDD region. Further, with respect of the contact section connecting to the other side of the source/drain regions having a potential equal to the first conductive-type well, the layout thereof is made in such a way that the distance between this contact section and the gate electrode in the direction of the gate length may be made smaller than the width of the LDD region lying between the gate electrode and that source/drain region in the direction of the gate length. The layout of this sort makes deterioration of element characteristics such as the leakage generation or the like difficult to occur even when the contact section is in contact with the LDD region, and, in addition, enables the spacing between the contact section and the gate electrode to shorten and, thus, facilitates to raise the degree of integration for the semiconductor device.

In a SRAM cell of the present embodiment, the load transistors $P_1$ and $P_2$ each consist of a p-type MOSFET with a LDD structure and, therein, the contact section connecting to the drain region is disposed so as not to come into contact with the LDD region lying on the side of that drain region, as shown in FIG. 3. In effect, the spacing W1 (corresponding to B1 and B2 in FIG. 4) between the gate electrode and the contact section connecting to the drain region in the direction of the gate length is set to be greater than the width W3 of the LDD region lying between the gate electrode and the drain region in the direction of the gate length. In addition to that, the contact section is preferably set on a silicide region so as not to come to contact directly with the dopant diffusion region. By arranging the contact section to take this disposition not to come into contact with the LDD region, it is possible to prevent boron in the LDD region from being drawn to the contact section and, consequently, suppress the generation of the leakage. Although this spacing W1 (B1, B2) can be appropriately set as long as the contact section does not come to contact with the LDD region, it is preferably set to be 0.08 $\mu$m or greater. To meet both of the requirement its dimension should be kept within the range not to make the memory size excessively large and the consideration for the capability of apparatus for mass production, at present, the spacing W1 (B1, B2) may be set to be 0.16 $\mu$m or so.

Against this, in the load transistors $P_1$ and $P_2$, the spacing W2 (corresponding to A1 and A2 in FIG. 4) between the gate electrode and the contact section connecting to the source region in the direction of the gate length is set to be smaller than the width W4 of the LDD region lying between the gate electrode and the source region in the direction of the gate length. In this case, even if the contact section comes into contact with the LDD region, a bias is not applied to a junction section of the dopant diffusion region, being on the side of the source region. Therefore, even if the dopant concentration in the LDD region on the side of the source region is somewhat changed with some of the boron being drawn out, the leakage does not occur. This spacing W2 (A1, A2) is preferably set to be 0.01 $\mu$m or greater, for the sake of securing satisfactory insulation, and may be set to be 0.13 $\mu$m or so to keep its dimension in a range not to make the memory size excessively large.

Further, in the driver transistors $D_1$ and $D_2$, each of which consists of an n-type MOSFET with a LDD structure, like in the load transistors, the contact section connecting to the drain region is preferably disposed so as not to come into contact with the LDD region lying on the side of that drain region. In effect, the spacing W1 (corresponding to F1 and F2 in FIG. 4) between the gate electrode and the contact section connecting to the drain region in the direction of the gate length is preferably set to be greater than the width W3 of the LDD region lying between the gate electrode and the drain region in the direction of the gate length. In addition to that, the contact section is preferably set on a silicide region so as not to come to contact directly with the dopant diffusion region. By arranging the contact section to take this disposition not to come into contact with the LDD region, it is possible to suppress the effect the physical contact may produce on element characteristics. Although this spacing W1 (F1, F2) can be appropriately set as long as the contact section does not come to contact with the LDD region, it is preferably set to be 0.06 µm or greater. To meet the requirement its dimension should be kept within the range not to make the memory size excessively large, the spacing W1 (F1, F2) may be set to be 0.16 µm or so.

Against this, in the driver transistors $D_1$ and $D_2$, the spacing W2 (corresponding to E1 and E2 in FIG. 4) between the gate electrode and the contact section connecting to the source region in the direction of the gate length is preferably set to be smaller than the width W4 of the LDD region lying between the gate electrode and the source region in the direction of the gate length. In this case, even if the contact section comes into contact with the LDD region, a bias is not applied to a junction section of the dopant diffusion region, being on the side of the source region. Therefore, the element characteristics are hardly affected by this physical contact. This spacing W2 (E1, E2) is preferably set to be 0.01 µm or greater for the sake of securing satisfactory insulation, and may be set to be 0.13 µm or so to keep its dimension in a range not to make the memory size excessively large.

In the load transistors and the driver transistors, the foregoing setting of the spacing W2 of FIG. 3 narrows the spacings A1, A2, E1 and E2 of FIG. 4 so that the width of the memory cell in the direction of the length of the word line can be reduced.

In the SRAM cell of the present embodiment, also in the transmission transistors $T_1$ and $T_2$, the contact section connecting to the source/drain region is preferably disposed so as not to come into contact with the LDD region lying on the side of that source/drain region. In this case, the spacing (corresponding to G1 and G2 in FIG. 4) between the gate electrode and the contact section connecting to a source/drain region lying on the side of the other periphery of the memory cell in the direction of the gate length is set to be greater than the width of the LDD region lying between the gate electrode and the foregoing source/drain region in the direction of the gate length. In addition to that, the contact section is preferably set on a silicide region so as not to come to contact directly with the dopant diffusion region. This spacing (G1, G2) is preferably set to be 0.06 µm or greater for the sake of securing satisfactory insulation, and may be set to be 0.13 µm or so to keep its dimension in a range not to make the memory size excessively large. Further, with respect to the contact section connecting to the other side of the source/drain regions (the contact section common to that connecting to the drain region of the driver transistor), it is also preferable that contact section is not in contact with the LDD region lying on the side of that source/drain region.

The structure described above is designed on the basis of the findings made by the present inventors that it is preferable to make the spacing between the gate electrode and the contact section smaller than the dimension of the LDD region in the dopant diffusion region having the same potential as the well potential, and greater than the dimension of the LDD region in the dopant diffusion region having a different potential from the well potential, and, especially in the p-type MOSFET, it is preferable to make the spacing therebetween greater than the dimension of the LDD region in the dopant diffusion region having a different potential from the well potential and besides to set the contact section on the silicide region.

It has been so far described that, together with suppressing deterioration of element characteristics such as the leakage generation, the present embodiment can make a reduction of the memory cell size successfully. Now, a further reduction of the memory cell size can be attained through the application of the foregoing specific layout structure respecting the spacing between the gate electrode and the contact section disposed in the source/drain region to a structure shown in FIG. 5 and FIGS. 6(a) and 6(b).

Figure 5:
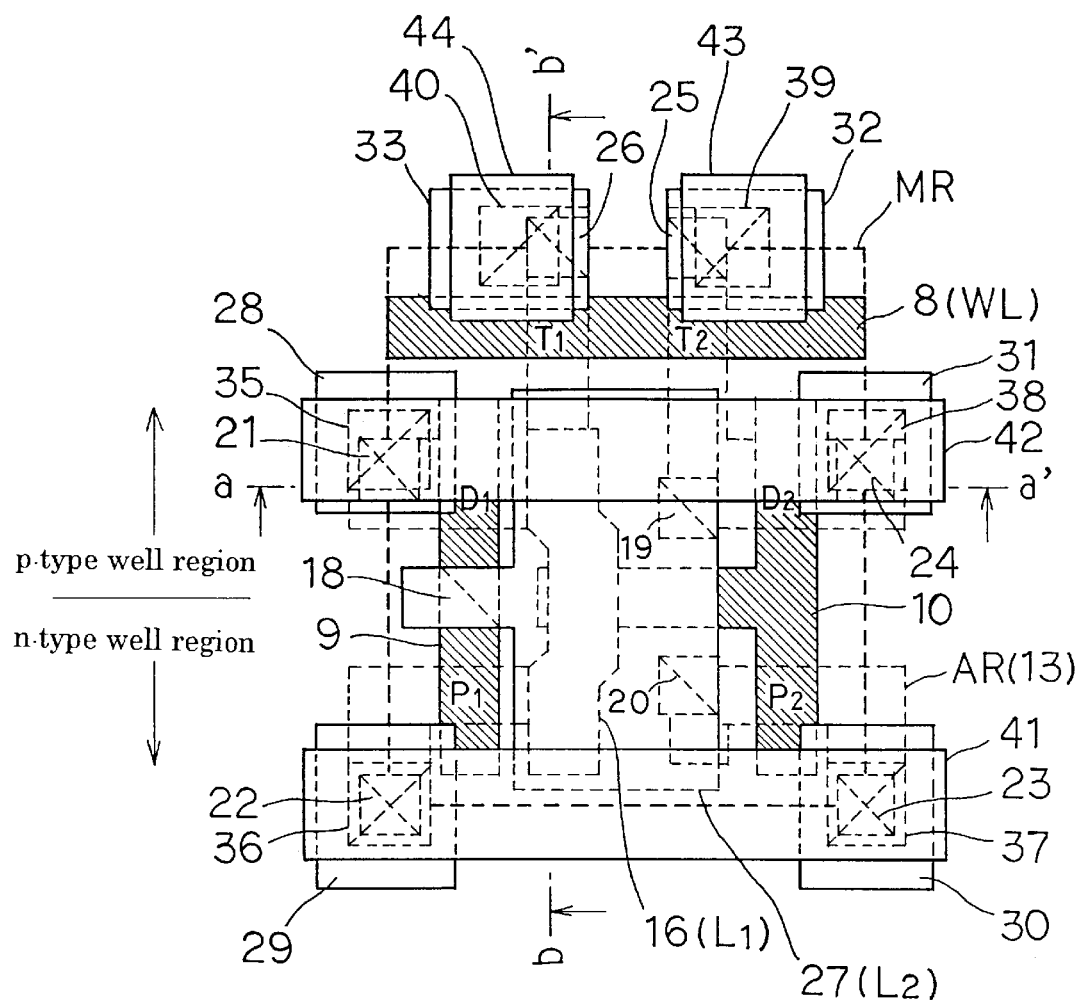
FIG. 5 is a plan view in explaining an embodiment of a SRAM cell in a semiconductor memory device according to the present invention.
Figure 6:
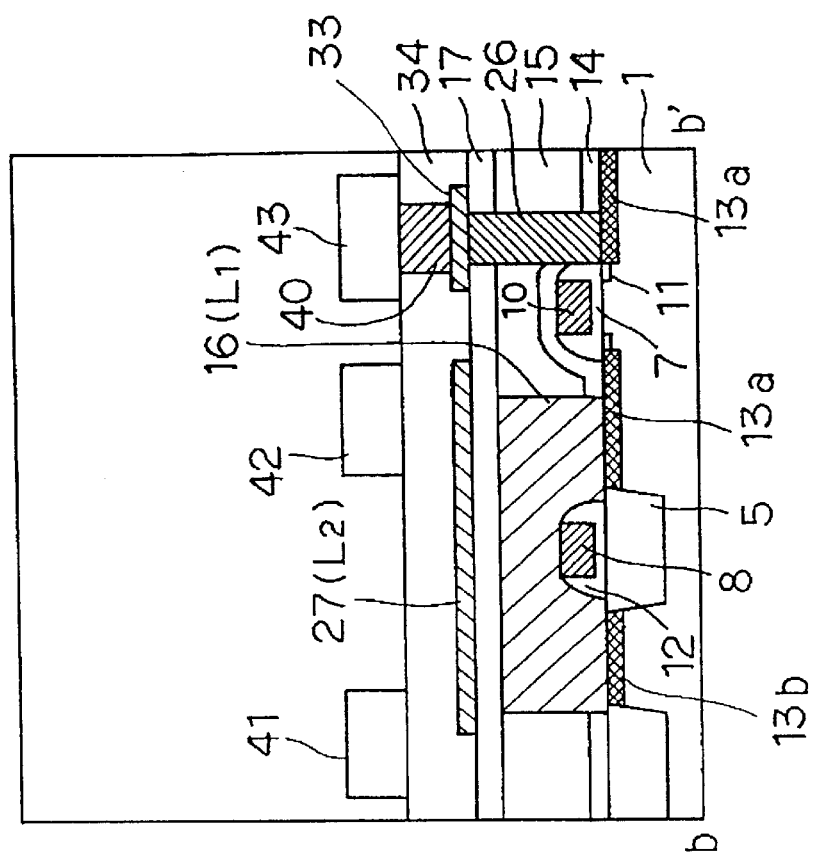
FIGS. 6(a) and 6(b) are cross-sectional views in explaining an embodiment of a SRAM cell in a semiconductor memory device according to the present invention.
Figure 6:
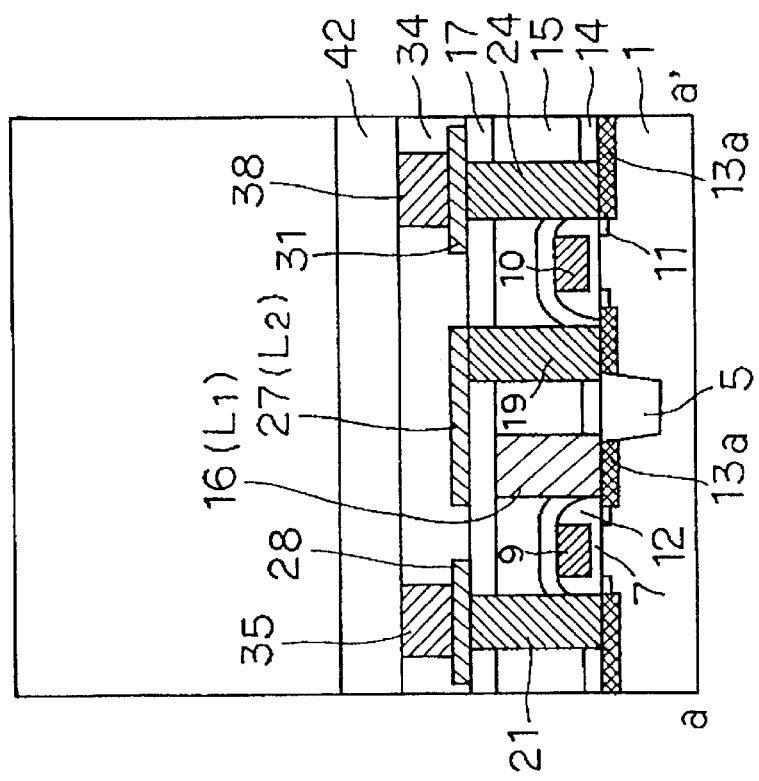

In the embodiment shown in FIG. 5 and FIGS. 6(a) and 6(b), a pair of local interconnections $L_1$ and $L_2$ are disposed in two different layers, with the local interconnection in a lower layer being formed of an inlaid (damascene) interconnection and the local interconnection in an upper layer, formed of a conductive film in the form of a plate. Further, the disposition of these local interconnection is arranged in such a way that, seen from the top surface (the top surface plane) of the substrate, a portion of the upper layer local interconnection (the plate-shaped interconnection) overlaps at least a portion of the top surface of the lower layer local interconnection (the inlaid interconnection), with an insulating film lying therebetween.

The foregoing inlaid interconnection which constitutes one of the local interconnections is formed, as one body, with the contact section set on the drain region of the load transistor $P_1$ and the contact section set on the drain region of the driver transistor $D_1$. In a SRAM cell of the present embodiment, this inlaid interconnection is disposed so as not to come into contact with the LDD region on the side of the drain region in any one of the load transistor $P_1$ and the driver transistor $D_1$. In other words, at least in the active regions, the distance between this inlaid interconnection and the gate electrode is set to become greater than the width of the LDD region lying between the gate electrode and the drain region in the direction of the gate length.

The layout structure in respect of other spacings between a gate electrode and the contact section set on a source/drain region may be set in the same way as the foregoing embodiment. However, in the structure shown in FIG. 5, contact sections 22 and 23 connecting to the source region of the load transistors $P_1$ and $P_2$, respectively, can take a layout in which the contact section is not in contact with the LDD region on the source region side, even if the spacing between the gate electrode and the contact section in the direction of the gate length is smaller than the width of the LDD region lying between the gate electrode and the source region in the direction of the gate length.

In the above structure, because the lower layer local interconnection (the inlaid interconnection) and the upper layer local interconnection (the plate-shaped interconnection), separated by an insulating film, constitute a capacitor element, in addition to the suppression of the leakage generation and a further reduction of the memory cell area, a-ray soft error resistance can be prevented from lowering, which may take place along with miniaturization of the memory cell size or a decrease in operation voltage.

Further, with this structure, if one of the local interconnections set in a lower layer is made of an inlaid interconnection, formation of this lower layer local interconnection can be made, together with formation of contact plugs so that fabrication thereof can be achieved with the considerably small number of the steps.

Referring to the drawings, the structure of the above SRAM cell is described specifically in detail below.

FIG. 5 is a plan view of a memory cell, and FIGS. 6(a) and (b) are cross-sectional views taken along the line a—a' and the line b—b' of FIG. 5, respectively. Any insulating film, bit line, and plug to connect to the bit line are, herein, omitted from the plan view.

6 transistors comprised in the memory cell are formed in active regions ARs each surrounded by element isolation regions 5 on a semiconductor substrate made of a single crystal silicon. N-channel type driver transistors $D_1$ and $D_2$ as well as transmission transistors $T_1$ and $T_2$ are formed in a p-type well region, while p-channel type load transistors $P_1$ and $P_2$, in an n-type well region.

A pair of transmission transistors $T_1$ and $T_2$ are each composed of n-type source/drain regions 13a formed in the active region of p-type well, a gate oxide film 7 formed on the surface of this active region, and a gate electrode 8 formed on this gate oxide film 7. This gate electrode 8 has, for example, a layered structure made of a doped polycrystalline silicon film and a refractory metal silicide film, such as a cobalt silicide film or the like, and is formed with a word line WL as one body. The word line WL is set running in a first direction (the left-right direction in FIG. 5) and, along this first direction, a pair of transmission transistors are disposed, adjacent to each other. Further, the disposition of the pair of transmission transistors is arranged in such a way that the direction of the gate length thereof coincides with a second direction (the top-bottom direction in FIG. 5), perpendicular to the first direction.

A pair of driver transistors $D_1$ and $D_2$ are each composed of n-type source/drain regions 13a formed in the active region of p-type well, a gate oxide film 7 formed on the surface of this active region, and a gate electrode 9 or 10 formed on this gate oxide film 7. This gate electrode 9 or 10 has, for example, a layered structure made of a doped polycrystalline silicon film and a refractory metal silicide film such as a cobalt silicide film or the like. The drain region of the driver transistor $D_1$ is formed in the active region in common with one of the source/drain regions of the transmission transistor $T_1$, while the drain region of the driver transistor $D_2$ is formed in the active region in common with one of the source/drain regions of the transmission transistor $T_2$.

A pair of load transistors $P_1$ and $P_2$ are each composed of p-type source/drain regions 13b formed in the active region of n-type well, a gate oxide film 7 formed on the surface of this active region, and a gate electrode 9 or 10 formed on this gate oxide film 7. The gate electrode 9 of the load transistor $P_1$ is formed with the gate electrode of the driver transistor $D_1$ as one body, while the gate electrode 10 of the load transistor $P_2$ is formed with the gate electrode of the driver transistor $D_2$ as one body.

It is preferable to set a refractory metal silicide layer (not shown in the drawings) such as a cobalt silicide layer or the like on the surface of every source/drain regions of a pair of driver transistors, a pair of load transistors and a pair of transmission transistors, for the purpose of reducing the sheet resistance and the contact resistance caused by the contact plug.

On the lateral face of every gate electrode that is contained in a pair of driver transistors, a pair of load transistors and a pair of transmission transistors, there is formed a sidewall 12.

On the top of any one of six transistors, a silicon nitride film 14 is formed, and, on the top of this silicon nitride film 14, a first interlayer insulating film 15 is formed to a thickness of 300 to 1000 nm or so from PSG (Phospho-Silicate Glass), BPSG (Boron Phosphorous Silicate Glass) or such.

Within this first interlayer insulating film 15, there is formed an inlaid interconnection 16 ($L_1$) that is one of a pair of local interconnections. To form this inlaid interconnection 16 ($L_1$), a trench is formed in the first interlayer insulating film 15 and filled up with a conductive metal such as tungsten. While one end section of this inlaid interconnection 16 ($L_1$) is electrically connected to the drain region of the driver transistor $D_1$, the other end section thereof is electrically connected to the drain region of the load transistor $P_1$. Further, the central section of the inlaid interconnection 16 ($L_1$) is electrically connected to the gate electrode 10, which serves for both of the driver transistor $D_2$ and the load transistor $P_2$. This gate electrode 10 branches off between the drain region of the driver transistor $D_2$ and the drain region of the load transistor $P_2$ towards the direction of transistors $D_1$ and $P_1$, and this branched section comes into contact with the central section of the inlaid interconnection 16.

On the first interlayer insulating film 15 in which the inlaid interconnection 16 ($L_1$) is formed, a second interlayer insulating film 17 is formed to a thickness of 10 to 150 nm or so from a silicon oxide film or the like. Further, contact holes formed through this second interlayer insulating film 17 and the first interlayer insulating film 15 are filled with a conductive metal such as tungsten to set contact plugs. These contact plugs are plugs 19–26 being in contact with respective source/drain regions of 6 transistors and a plug 18 being in contact with the gate electrode 9, which is used by the driver transistor $D_1$ and the load transistor $P_1$ in common.

On the top of the second interlayer insulating film 17, there is formed a local interconnection 27 ($L_2$) from TiN or such to a thickness of 100 to 200 nm or so. The local interconnection 27 ($L_2$) is set connecting electrically to the plug 18 that is connected with the gate electrode 9, common to the driver transistor $D_1$ and the load transistor $P_1$, the plug 19 that is connected with the drain region of the driver transistor $D_2$, and the plug 20 that is connected with the drain region of the load transistor $P_2$. Further, the disposition of the local interconnection 27 ($L_1$) is arranged in such a way that a portion thereof overlaps, at least, a portion of the top surface of the afore-mentioned inlaid interconnection 16 ($L_1$) which is the other local interconnection, with the second interlayer insulating film 17 lying therebetween. The local interconnection 27 ($L_2$) and the inlaid interconnection 16 ($L_1$), separated by the second interlayer insulating film, constitute a capacitor element. In view of the effect of a capacitor element, the local interconnection 27 ($L_2$) is preferably set covering the top surface of the inlaid interconnection 16 ($L_1$) as much as possible, and, in the structure shown in FIG. 5, the local interconnection 27 ($L_2$) covers the entire top surface of the inlaid interconnection 16 ($L_1$).

Further, in order to facilitate the connection with the via plugs which are further connected to the above layers, on the contact plugs 21–26, there are provided with respective rectangular conductive film patterns 28–33, which are concurrently formed with the local interconnection 27 ($L_2$) by patterning.

On the top of the second interlayer insulating film 17 in which the local interconnection 27 ($L_2$) is formed, a third interlayer insulating film 34 is formed from a silicon oxide film or the like and, thereon, a supply voltage line 41 to apply a supply voltage $V_{cc}$, a reference voltage line 42 to apply a reference voltage $V_{ss}$, are formed along the afore-mentioned first direction. The supply voltage line 41 is electrically connected through via plugs 36 and 37 set in the third interlayer insulating film 34 and contact plugs 22 and 23 set in the first and second interlayer insulating films, to the source regions of the load transistors $P_1$ and $P_2$, respectively. The reference voltage line 42 is electrically connected through via plugs 35 and 38 set in the third interlayer insulating film 34 and contact plugs 21 and 24 set in the first and second interlayer insulating films, to the source regions of the driver transistors $D_1$ and $D_2$, respectively. These interconnections can be formed, for example, from a patterned aluminium film or a layered film comprising an aluminium film and films of TiN or the like which may be laid over the aluminium film as an anti-reflection coating film, and laid below the aluminium film as a barrier metal film.

Further, in order to facilitate the connection with the via plugs which are further connected to the above layers, on the top of the plugs 39 and 40 which are set in the third interlayer insulating film 34 for making electrical connection to one side of the source/drain regions of the transmission transistors $T_1$ and $T_2$, there are provided with respective rectangular conductive film patterns 43 and 44, which are concurrently formed with the supply voltage line 41 and the reference voltage line 42 by patterning.

On the top of the third interlayer insulating film 34 in which the supply voltage line 41 and the reference voltage line 42 are formed, a fourth interlayer insulating film (not shown in the drawings) is formed from a silicon oxide film or the like and, thereon, a pair of bit lines $BL_1$ and $BL_2$ (not shown in the drawings) are formed along the afore-mentioned second direction. One of the bit lines $BL_1$ is electrically connected, through a via plug set in the fourth interlayer insulating film, and the via plug 40 set in the third interlayer insulating film and the contact plug 26 set in the first and second interlayer insulating films, to one side of the source/drain regions of the transmission transistor $T_1$. The other bit line $BL_2$ is electrically connected, through a via plug set in the fourth interlayer insulating film, and the via plug 39 set in the third interlayer insulating film and the contact plug 25 set in the first and second interlayer insulating films as well as the third interlayer insulating film, to one side of the source/drain regions of the transmission transistor $T_2$. These interconnections can be formed, for example, from a patterned aluminium film or a layered film comprising an aluminium film and films of TiN or the like which may be laid over the aluminium film as an anti-reflection coating film, and laid below the aluminium film as a barrier metal film.

Next, a method of manufacturing a SRAM cell in a semiconductor memory device of the present invention is described, with reference to the drawings. The plan view, herein, are presented with some insulating films appropriately omitted therefrom.

Figure 7:
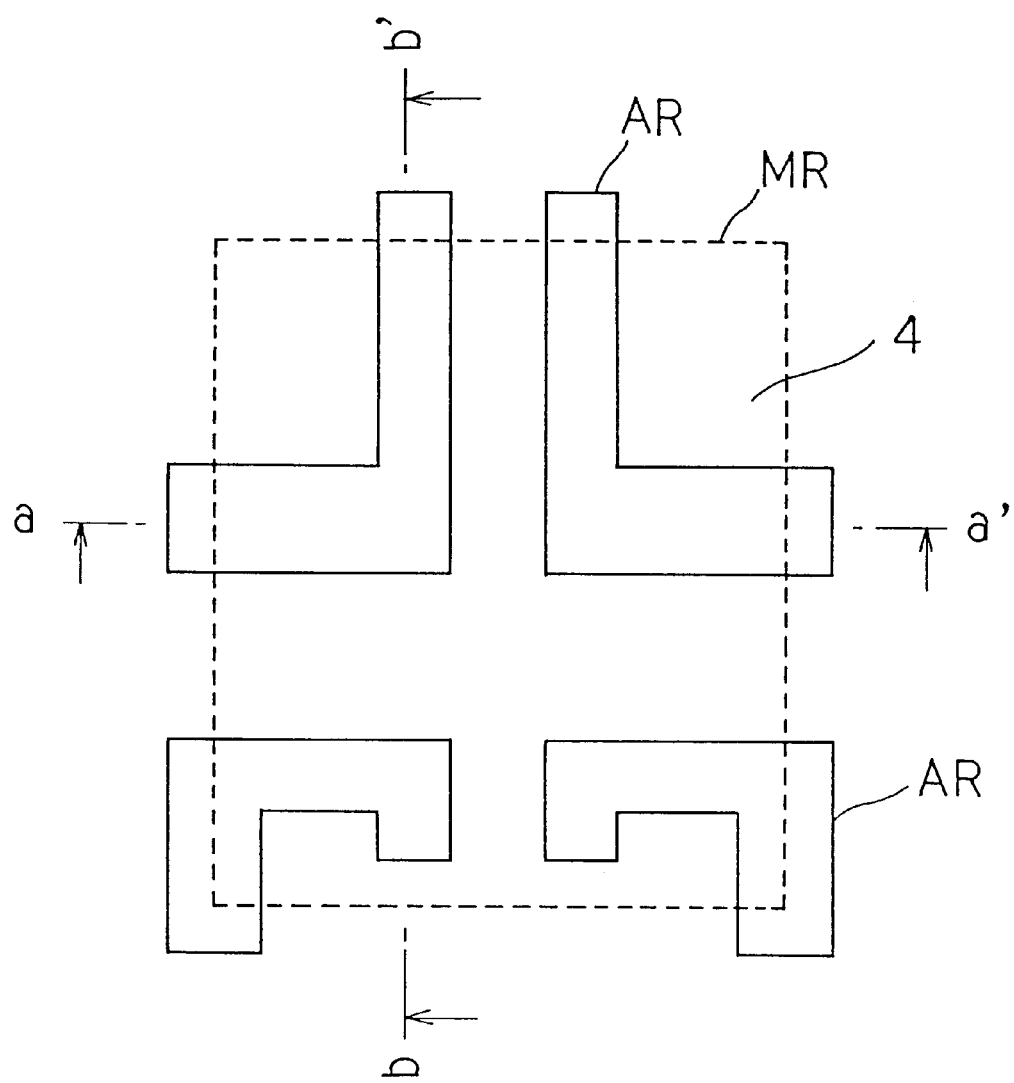
FIG. 7 is a plan view in explaining a manufacturing method of a SRAM cell in a semiconductor memory device according to the present invention.
Figure 8:
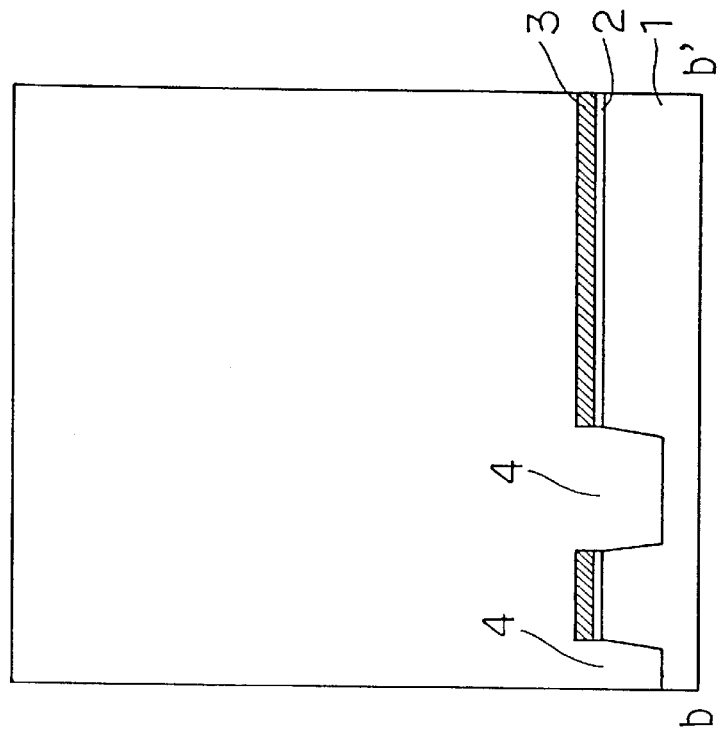
FIGS. 8(a) and 8(b) are cross-sectional views in explaining a manufacturing method of a SRAM cell in a semiconductor memory device according to the present invention.
Figure 8:
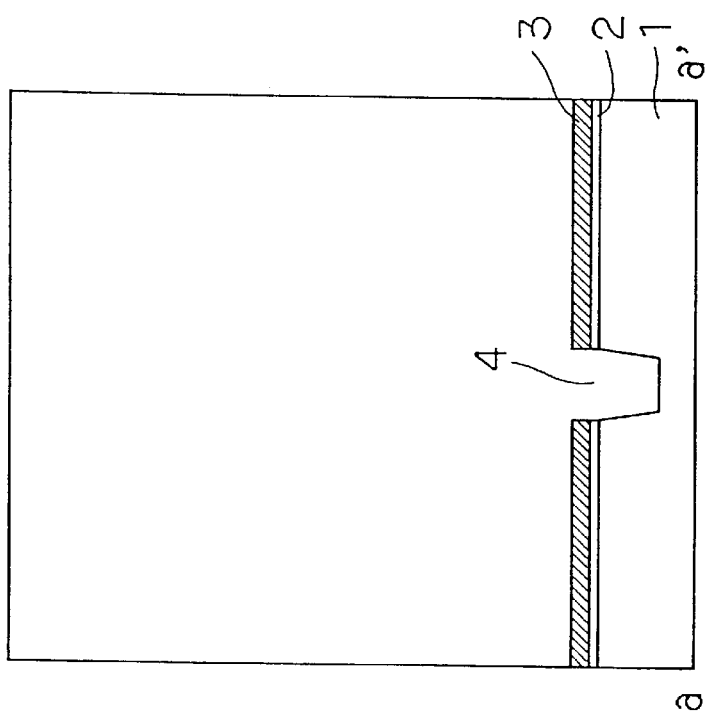

First, on the principal plane of a semiconductor substrate 1 made of a p-type single crystal silicon, a silicon oxide film 2 and a silicon nitride film 3 are formed, in succession, by a known method. Using, as a mask, a photoresist in the shape of a prescribed pattern which is formed by a known method, dry etching is then applied thereto and the silicon nitride film 3 and the silicon oxide film 2 are patterned. After that, using the remained silicon nitride film 3 and silicon oxide film 2 as a mask, the semiconductor substrate 1 is dry etched to form trenches 4 for element isolation (FIG. 7 and FIGS. 8(a) and 8(b)). In the drawings, hereat, regions indicated by AR are active regions and, in this step, trenches for element isolation are formed in regions other than ARs. Further, a region indicated by MR, which is encircled by a dotted line represents a region for one memory cell. A plurality of memory cells are disposed in such a way that, with each side of a rectangle indicated by MR that runs along the afore-mentioned first direction (the left-right direction in FIG. 7) being used as a line of symmetry, the shapes indicated by AR between neighbouring memory cells in the afore-mentioned second direction (the top-down direction in FIG. 7) become symmetric images (mirror operation), while, with each side of a rectangle indicated by MR that runs along the afore-mentioned second direction being used as a datum line, the shapes indicated by AR between neighbouring memory cells in the afore-mentioned first direction become images shifted to the first direction (parallel translation). It is also possible to dispose memory cells so that the shapes indicated by AR between every two neighbouring memory cells may become symmetric, with respect to the common side of rectangles indicated by MR.

Figure 9:
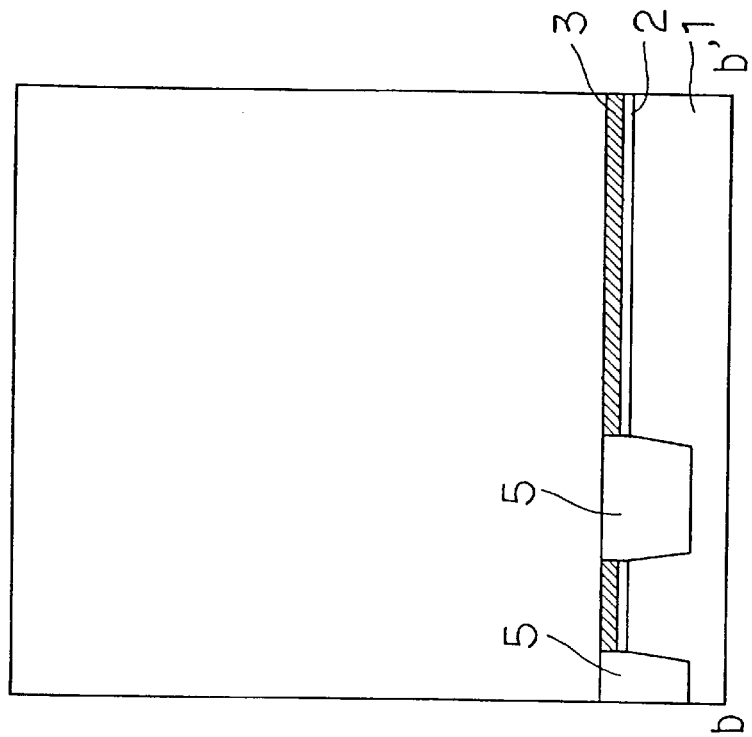
FIGS. 9(a) and 9(b) are cross-sectional views in explaining a manufacturing method of a SRAM cell in a semiconductor memory device according to the present invention.
Figure 9:
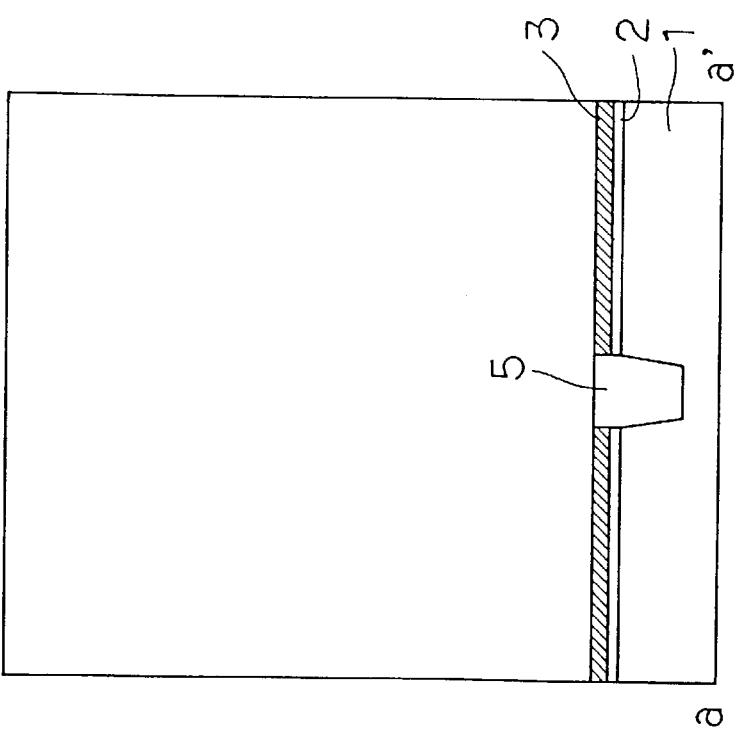

Next, as shown in FIGS. 9(a) and 9(b), the inside of the trenches 4 is filled with a silicon oxide film, and element isolation regions 5 are formed. The formation of the element isolation regions 5 can be made as follows. On a semiconductor substrate 1 in which trenches 4 are set, a silicon oxide film is formed thick enough to fill up the inside of the trenches 4 completely by the CVD (Chemical Vapour Deposition) method, and thereafter, using the silicon nitride film 3 as a stopper, etch back or chemical mechanical polishing (CMP) is applied to the thickly formed silicon oxide film to remove the silicon oxide film other than portions thereof lying inside of the trenches 4, whereby the element isolation regions 5 are formed.

Figure 10:
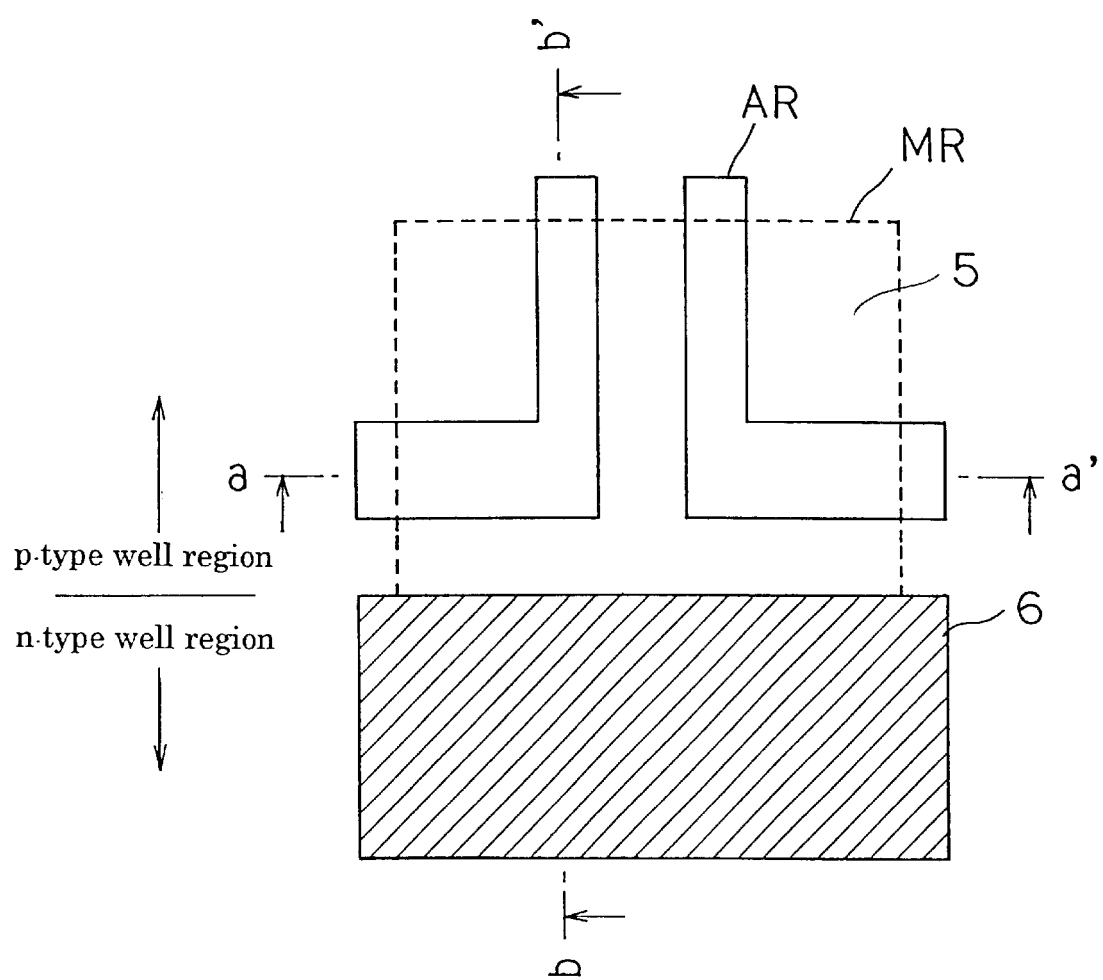
FIG. 10 is a plan view in explaining a manufacturing method of a SRAM cell in a semiconductor memory device according to the present invention.
Figure 11:
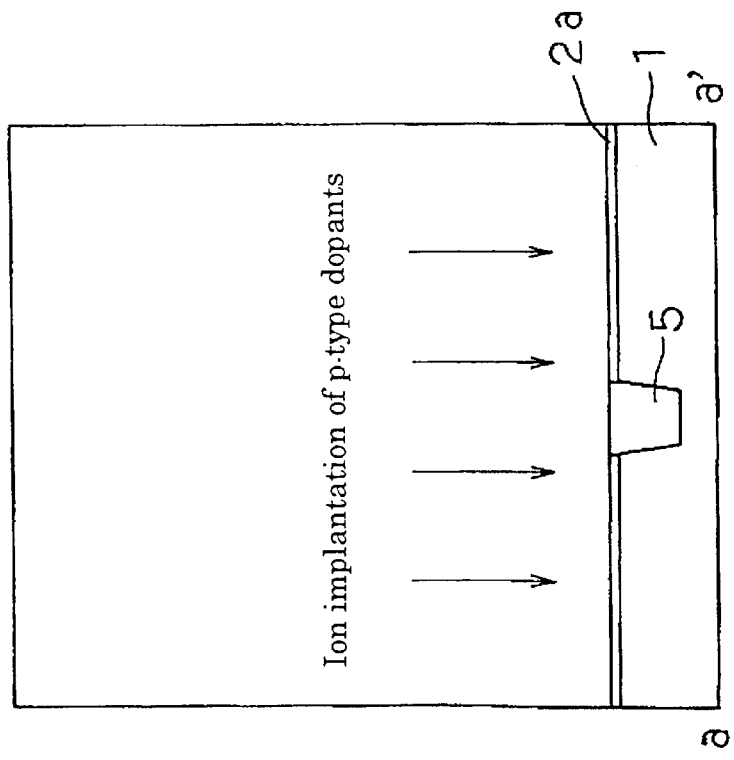
FIGS. 11(a) and 11(b) are cross-sectional views in explaining a manufacturing method of a SRAM cell in a semiconductor memory device according to the present invention.
Figure 11:
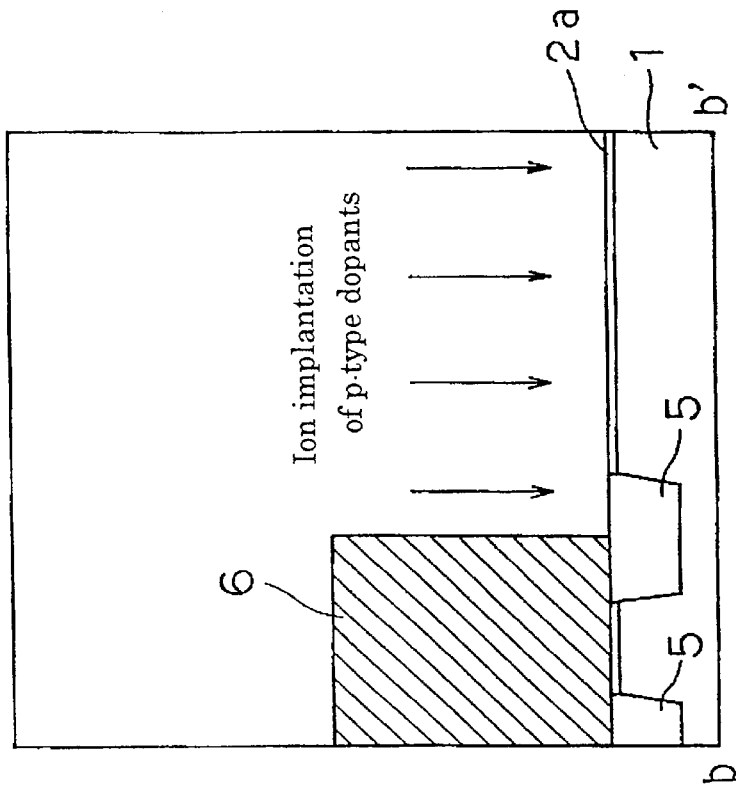

Next, after the silicon nitride film 3 and the silicon oxide film 2 on the semiconductor substrate 1 are removed by etching, a thin silicon oxide film (a sacrifice oxide film) 2a with a thickness of 10 to 30 nm or so is formed and then a resist 6 is formed in a region where load transistors $P_1$ and $P_2$ are to be formed, as shown in FIG. 10 and FIGS. 11(a) and 11(b). Using this resist 6 and the afore-mentioned oxide film 2a as a mask and a through film, respectively, ion-implantation of p-type dopants (for example, boron, $BF_2$) is applied thereto to form a p-type well region where load transistors $D_1$ and $D_2$ and transmission transistors $T_1$ and $T_2$ are to be formed later. Next, after removing the resist 6, another resist is formed on the p-type well region, and using this resist and the afore-mentioned oxide film 2a as a mask and a through film, respectively, ion implantation of n-type dopants (for example, phosphorus or arsenic) is applied thereto to form an n-type well region where load transistors $P_1$ and $P_2$ are to be formed later.

Figure 12:
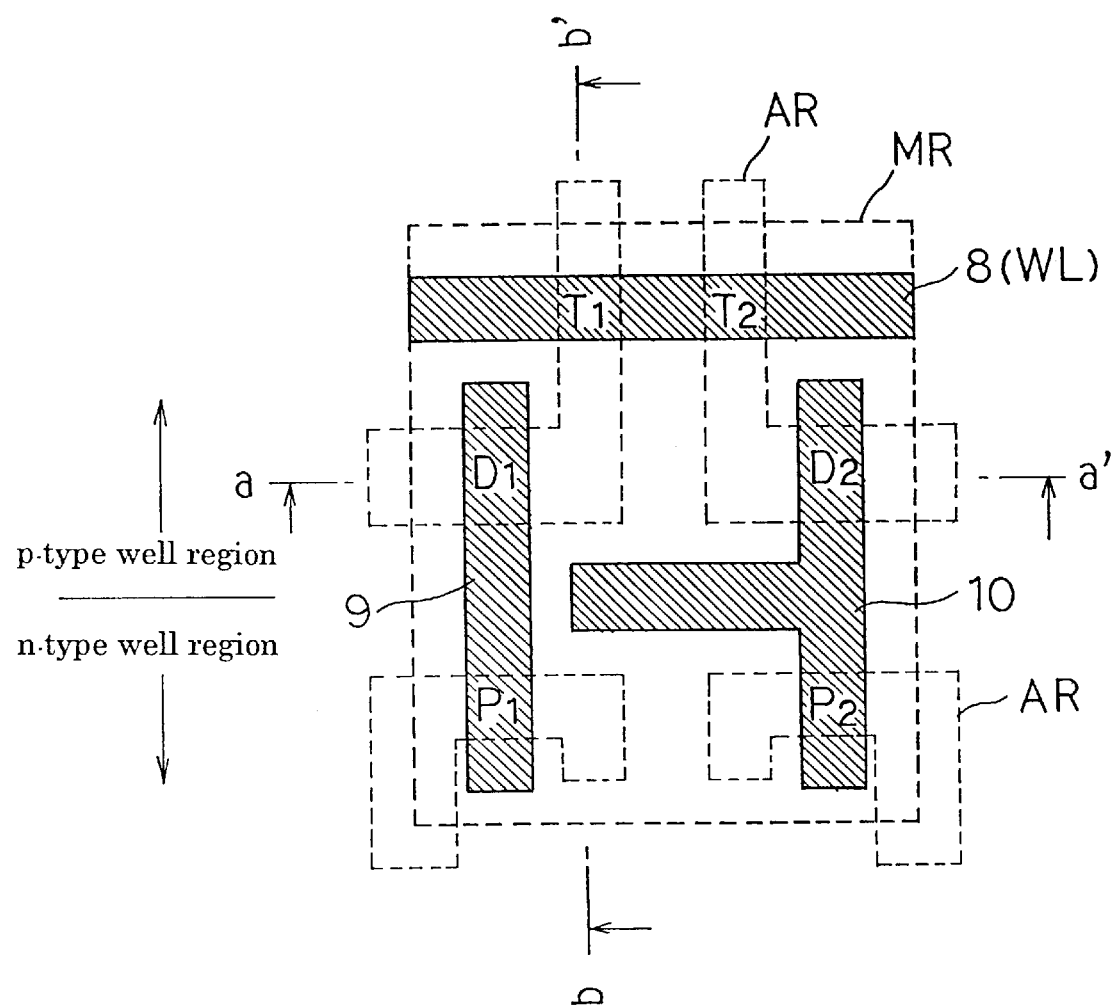
FIG. 12 is a plan view in explaining a manufacturing method of a SRAM cell in a semiconductor memory device according to the present invention.
Figure 13:
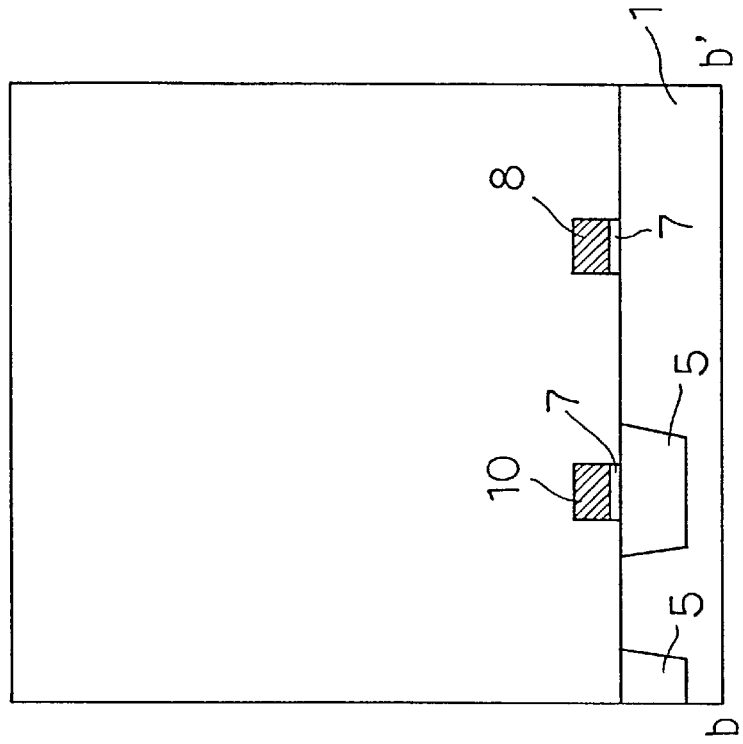
FIGS. 13(a) and 13(b) are cross-sectional views in explaining a manufacturing method of a SRAM cell in a semiconductor memory device according to the present invention.
Figure 13:
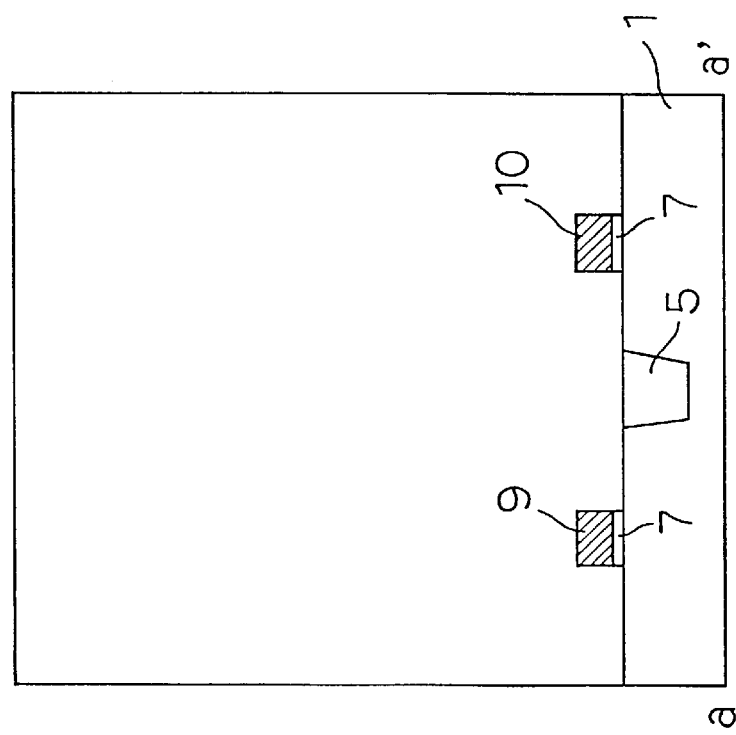

Next, after removing the silicon oxide film (the sacrifice oxide film) 2a lying on the semiconductor substrate, a gate oxide film is formed by the thermal oxidation method, and then a doped polycrystalline silicon film is formed. Thereat, after forming a refractory metal silicide film such as a tungsten silicide film on the doped polycrystalline silicon film, a silicone oxide film for formation of a cap layer may be formed thereon. Next, using a photoresist formed into a prescribed pattern as a mask, dry etching is performed and thereby the doped polycrystalline silicon film and the gate oxide film are concurrently patterned, and a gate electrode 8 (a word line WL) of the transmission transistors $T_1$ and $T_2$, gate electrodes 9 and 10 of the driver transistors $D_1$ and $D_2$ and load transistors $P_1$ and $P_2$ are formed, as shown in FIG. 12 and FIGS. 13(a) and 13(b).

Figure 14:
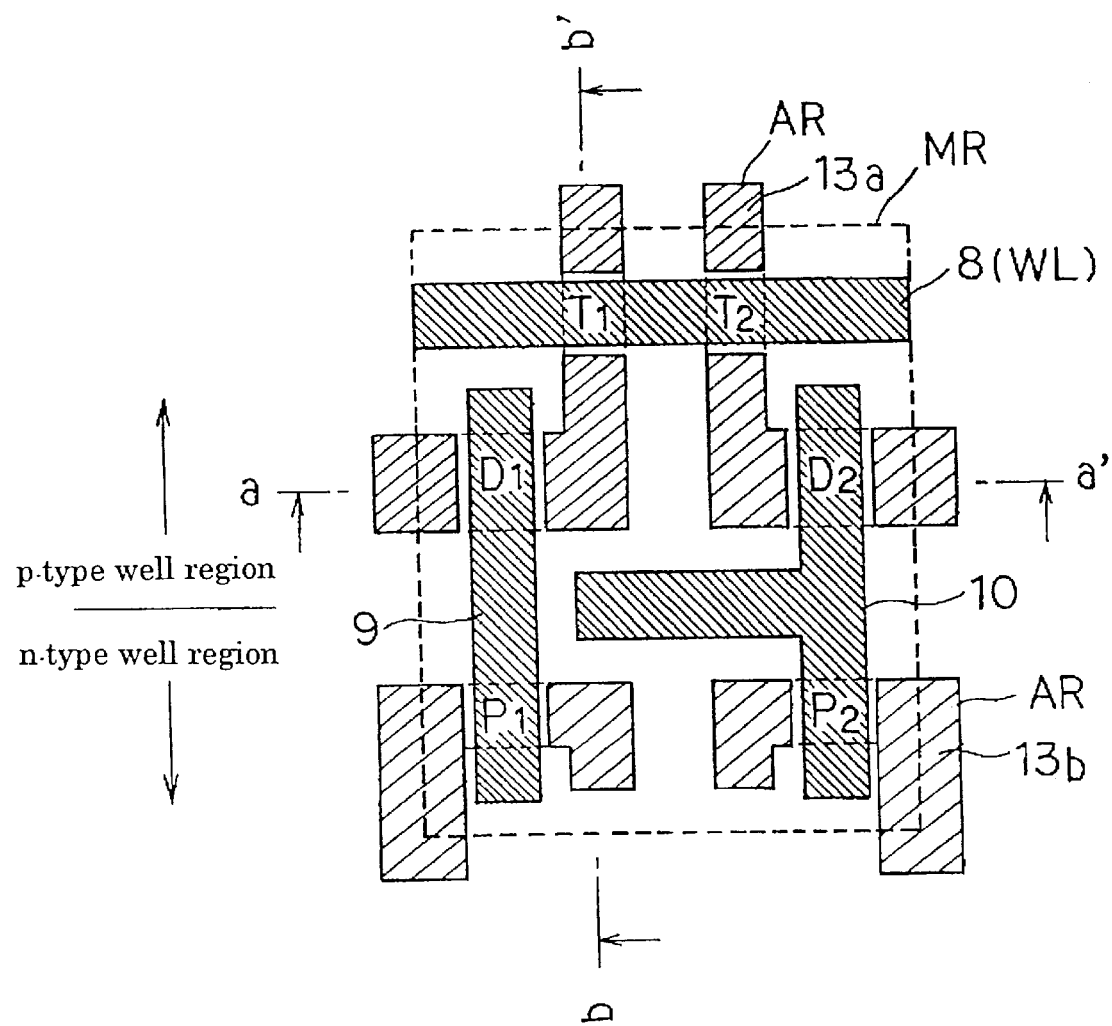
FIG. 14 is a plan view in explaining a manufacturing method of a SRAM cell in a semiconductor memory device according to the present invention.
Figure 15:
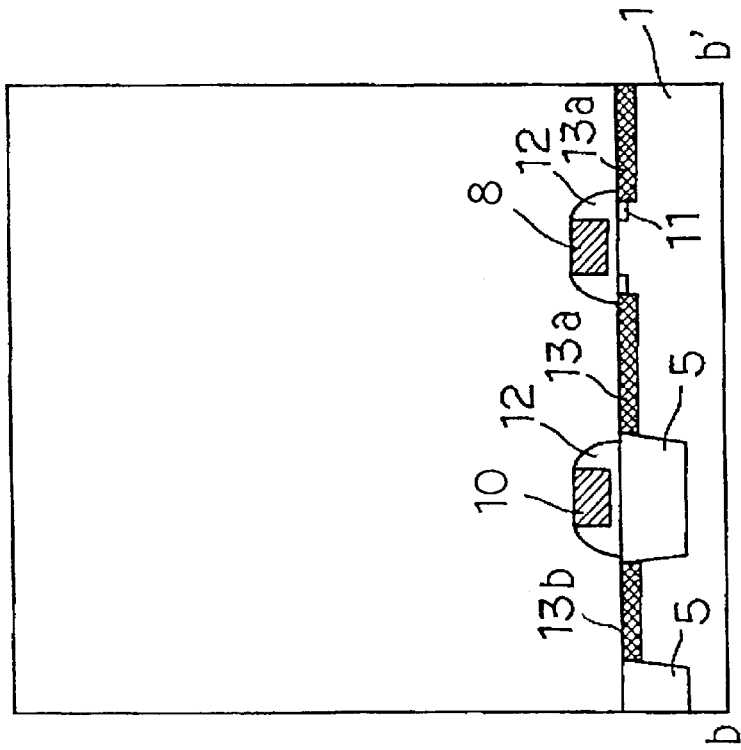
FIGS. 15(a) and 15(b) are cross-sectional views in explaining a manufacturing method of a SRAM cell in a semiconductor memory device according to the present invention.
Figure 15:
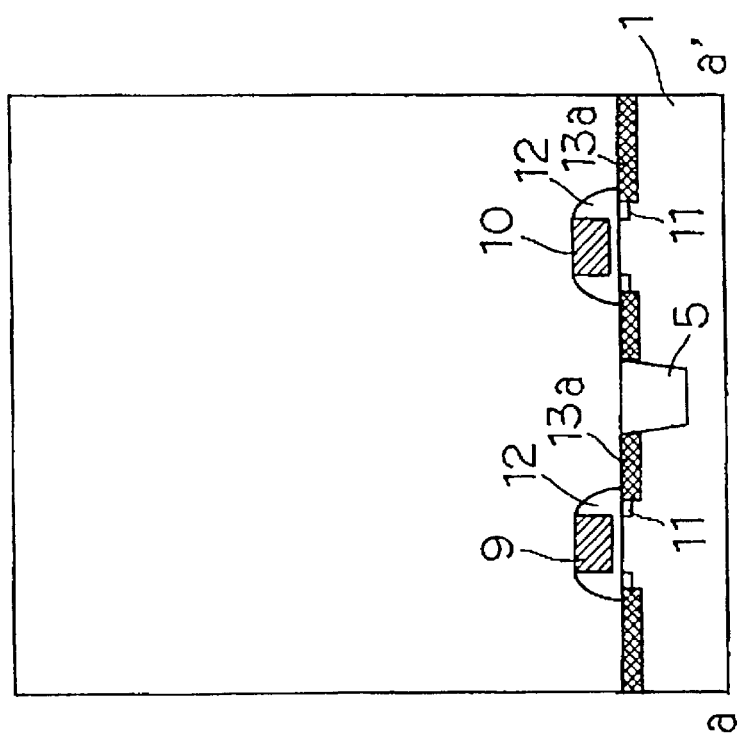

Next, a transistor structure shown in FIG. 14 and FIGS. 15(a) and 15(b) is formed as follows. Using a resist formed on the n-type well region as a mask, ion implantation of n-type dopants (for example, phosphorus or arsenic) is applied thereto with a relatively small dose to form LDD (Lightly-Doped Drain) regions 11 in the p-type well region. After removing this resist, using another resist formed on the p-type well region as a mask, ion implantation of p-type dopants (for example, boron, $BF_2$) is similarly applied thereto to form LDD regions 11 in the n-type well region. Next, after this resist is removed, a silicon oxide film is formed on the substrate by the CVD method, and by subjecting this silicon oxide film to etch back, sidewalls 12 are formed on the lateral faces of the gate electrodes. After that, using a resist formed on the n-type well region as a mask, ion implantation of n-type dopants is applied thereto with a relatively large dose to form n-type source/drain regions 13a in the p-type well region. Subsequently, after removing this resist, using another resist formed on the p-type well region as a mask, ion implantation of p-type dopants (for example, boron, $BF_2$) is similarly applied thereto to form p-type source/drain regions 13b in the n-type well region.

After this step is completed, on the source/drain regions, refractory metal silicide films are preferably formed. First, on the semiconductor substrate, a refractory metal film of Co or the like is formed by the sputtering method or such. Next, by annealing, the refractory metal film and the source/drain regions are made to react with each other, and thereafter unreacted refractory metal is removed by etching, whereby a refractory metal silicide film is formed on the source/drain regions. If, in the step described above, no tungsten silicide film or silicon oxide film is formed on the gate electrodes, refractory metal silicide films are, hereat, formed on the gate electrodes.

Figure 16:
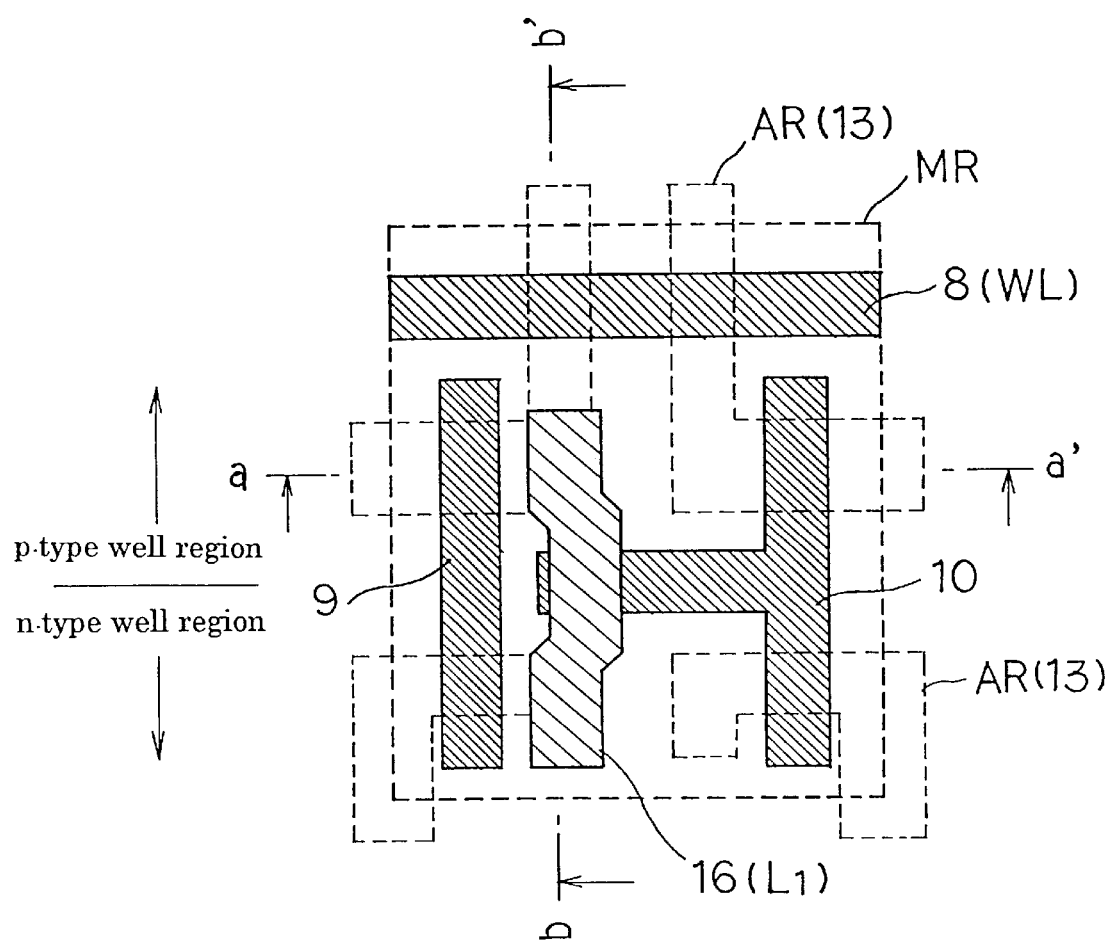
FIG. 16 is a plan view in explaining a manufacturing method of a SRAM cell in a semiconductor memory device according to the present invention.
Figure 17:
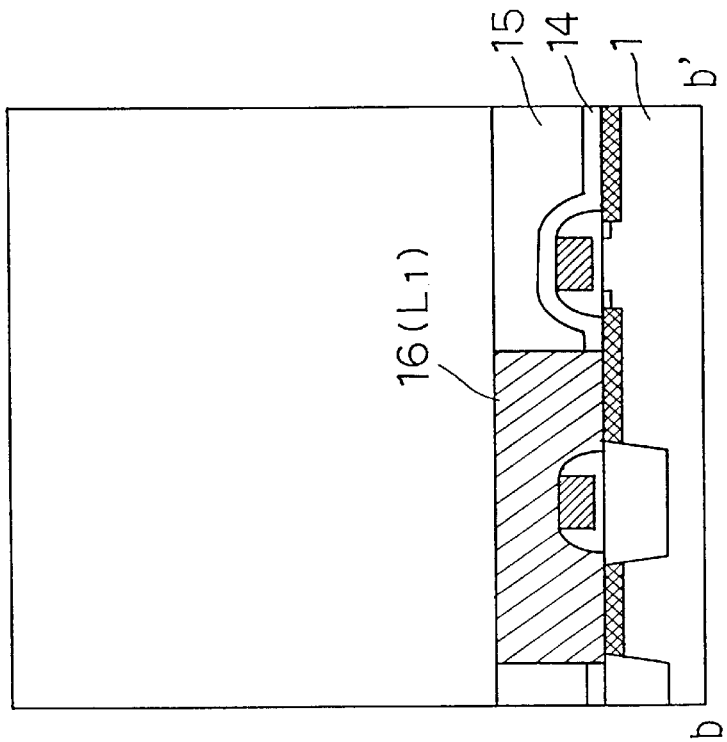
FIGS. 17(a) and 17(b) are cross-sectional views in explaining a manufacturing method of a SRAM cell in a semiconductor memory device according to the present invention.
Figure 17:
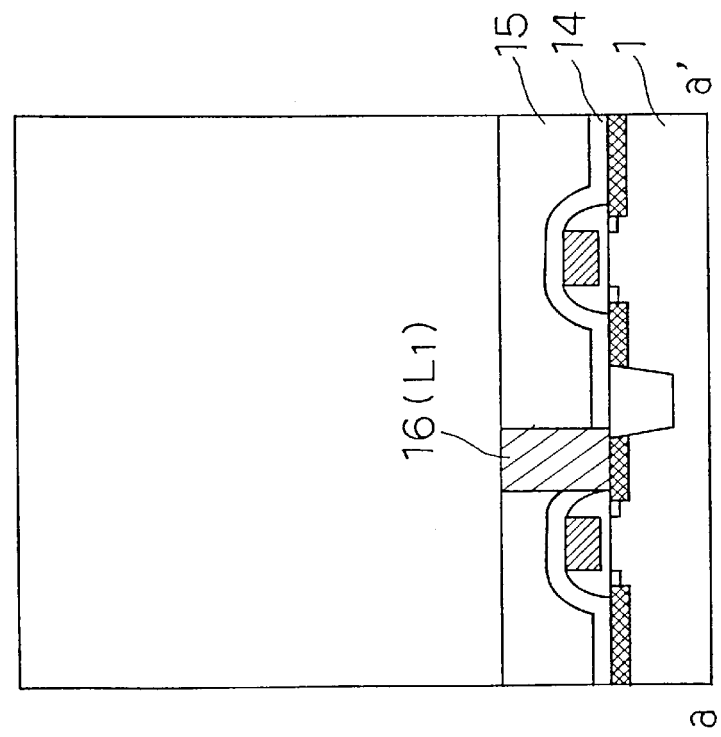

Next, after a silicon nitride film 14 is formed on the semiconductor substrate by the CVD method, an interlayer insulating film 15 is formed from PSG, BPSG or the like. Using a photoresist formed into a prescribed pattern as a mask, dry etching is then performed to make openings through the first interlayer insulating film 15 as well as the silicon nitride film 14, and thereby trenches to reach the substrate surface and the gate electrodes are formed. By filling up these trenches with a conductive metal such as W, a local interconnection 16 ($L_1$) made of an inlaid interconnection is formed, as shown in FIG. 16 and FIGS. 17(a) and 17(b). Thereat, filling up the trenches with a conductive metal is carried out as follows. A barrier metal film is formed on the substrate including the inside of the trenches, for example, from a layered film of Ti/TiN or the like by the sputtering method or such, and thereafter, by the CVD method or such, a conductive metal film is formed from tungsten or the like so as to fill up the trenches, and, subsequently, CMP is applied to these metal films to remove the conductive metal film and the barrier metal film other than the portions thereof lying inside of the trenches.

Figure 18:
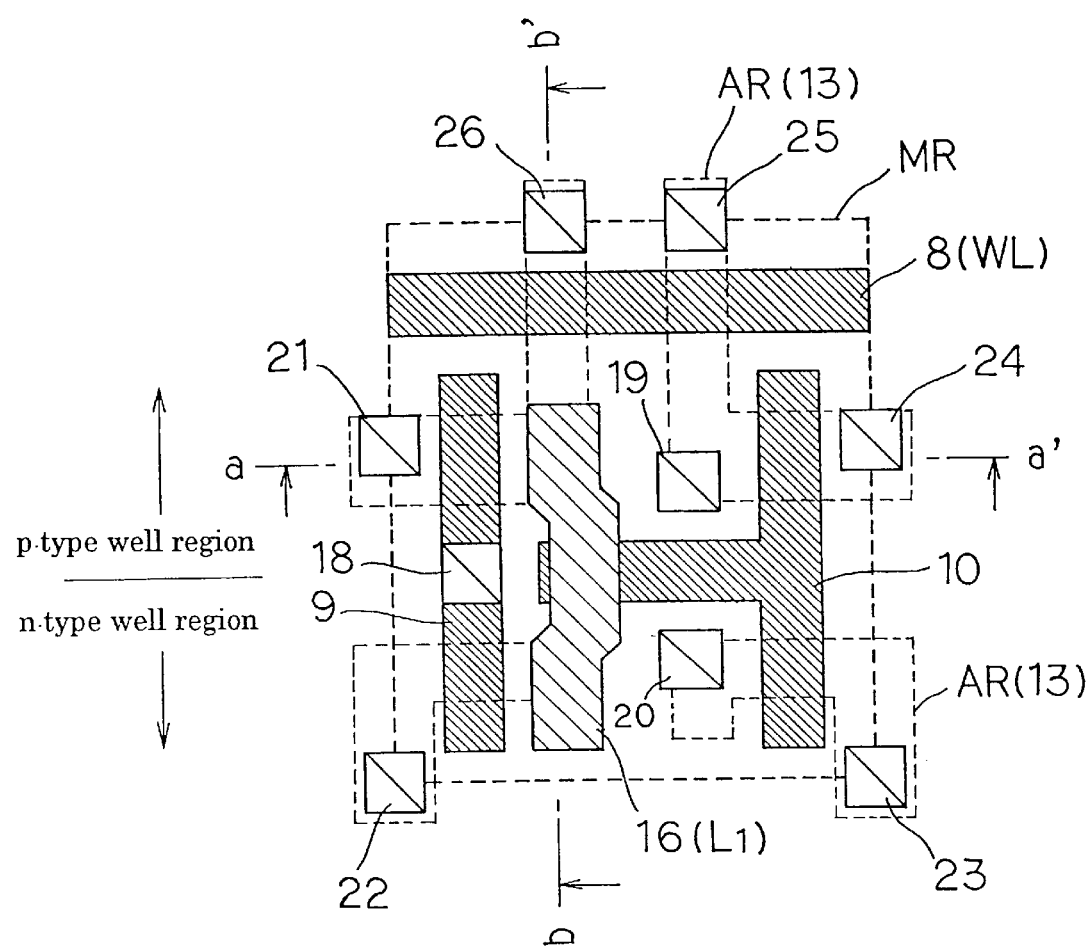
FIG. 18 is a plan view in explaining a manufacturing method of a SRAM cell in a semiconductor memory device according to the present invention.
Figure 19:
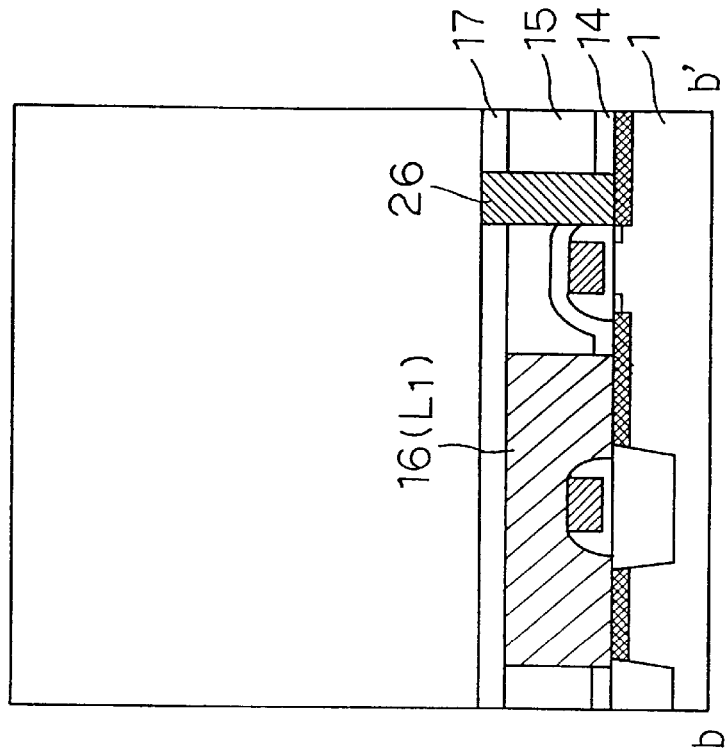
FIGS. 19(a) and 19(b) are cross-sectional views in explaining a manufacturing method of a SRAM cell in a semiconductor memory device according to the present invention.
Figure 19:
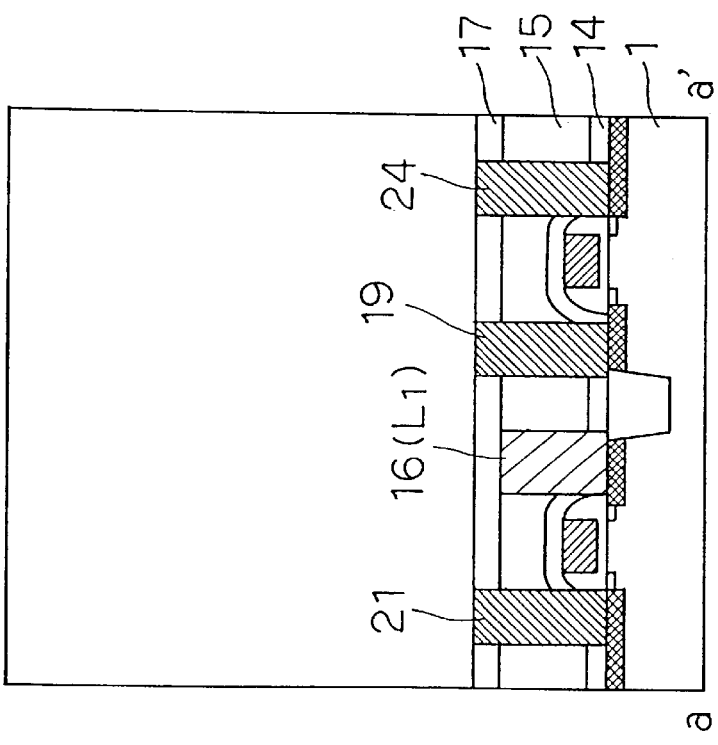

Next, after a second interlayer insulating film 17 is formed from a silicon oxide film or the like by the CVD method, using a photoresist as a mask, dry etching is performed and a contact hole to reach the gate electrode 9 and a contact hole to reach source/drain regions are concurrently formed. A barrier metal film is then formed on the substrate surface including the inside of the contact holes from a layered film of Ti/TiN or the like, and thereafter a conductive metal film of W or the like is formed by the CVD method or such so as to fill up these contact holes, and then CMP is applied to these metal films to remove the conductive metal film and the barrier metal film lying in regions other than the inside of the contact holes. By this, as shown in FIG. 18 and FIGS. 19(a) and 19(b), a contact plug 18 to reach the gate electrode 9, and contact plugs 19–26 to reach source/drain regions are concurrently formed.

Figure 20:
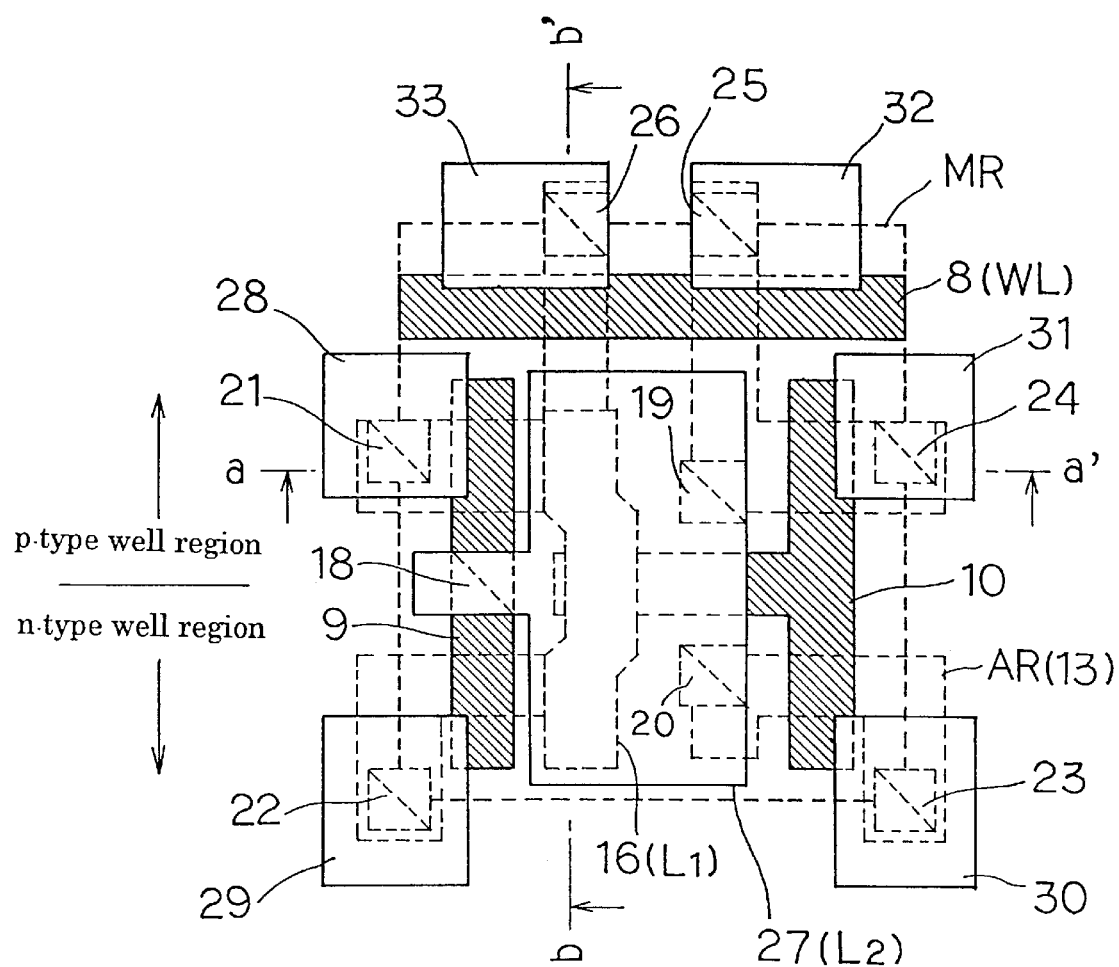
FIG. 20 is a plan view in explaining a manufacturing method of a SRAM cell in a semiconductor memory device according to the present invention.
Figure 21:
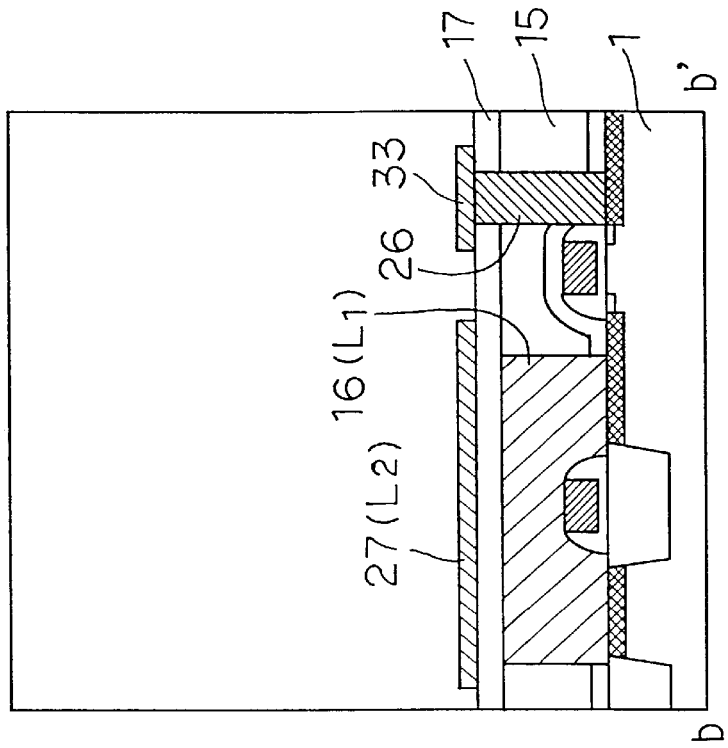
FIGS. 21(a) and 21(b) are cross-sectional views in explaining a manufacturing method of a SRAM cell in a semiconductor memory device according to the present invention.
Figure 21:
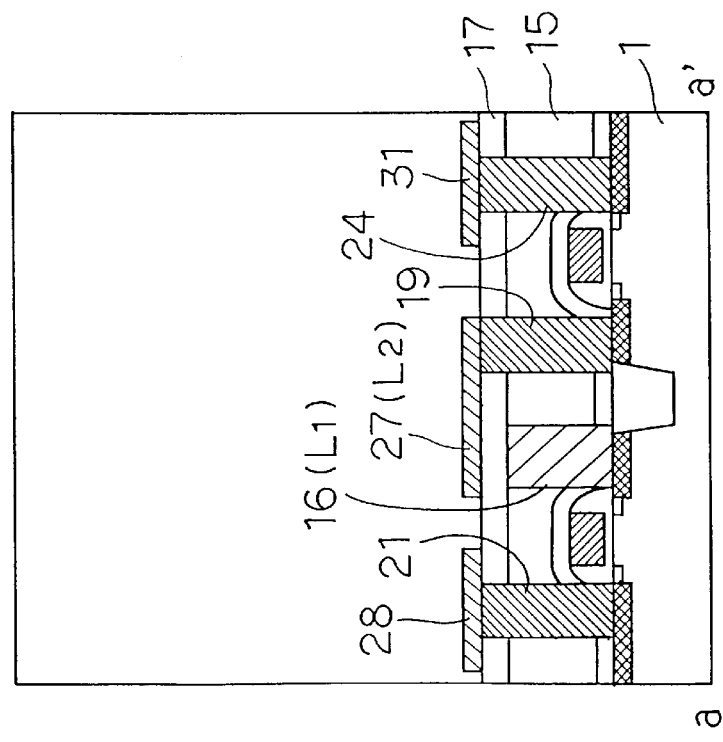

Next, a conductive film is formed from a TiN film or the like by the sputtering method or the CVD method, and patterning is applied to this conductive film with a photoresist used as a mask, whereby a local interconnection ($L_2$) 27 that is to be in contact with contact plugs 18, 19 and 20 is formed, as shown in FIG. 20 and FIGS. 21(a) and 21(b). Thereat, the local interconnection ($L_2$) 27 is formed so that, seen from the top surface, a portion thereof overlaps, at least, a portion of the lower layer local interconnection ($L_1$) 16 with the second interlayer insulating film 17 lying therebetween. In the drawings, the local interconnection ($L_2$) 27 is formed so as to overlap the entire top surface of the lower layer local interconnection ($L_1$) 16.

When patterning to form the local interconnection ($L_2$) 27 is carried out, on contact plugs 21–26, rectangular conductive film patterns 28–33 that are in contact therewith and covering the top surface thereof are concurrently formed, respectively, in order to facilitate the connection between respective contact plugs 21–26 and corresponding via plugs that are to be formed later in upper layers.

Figure 22:
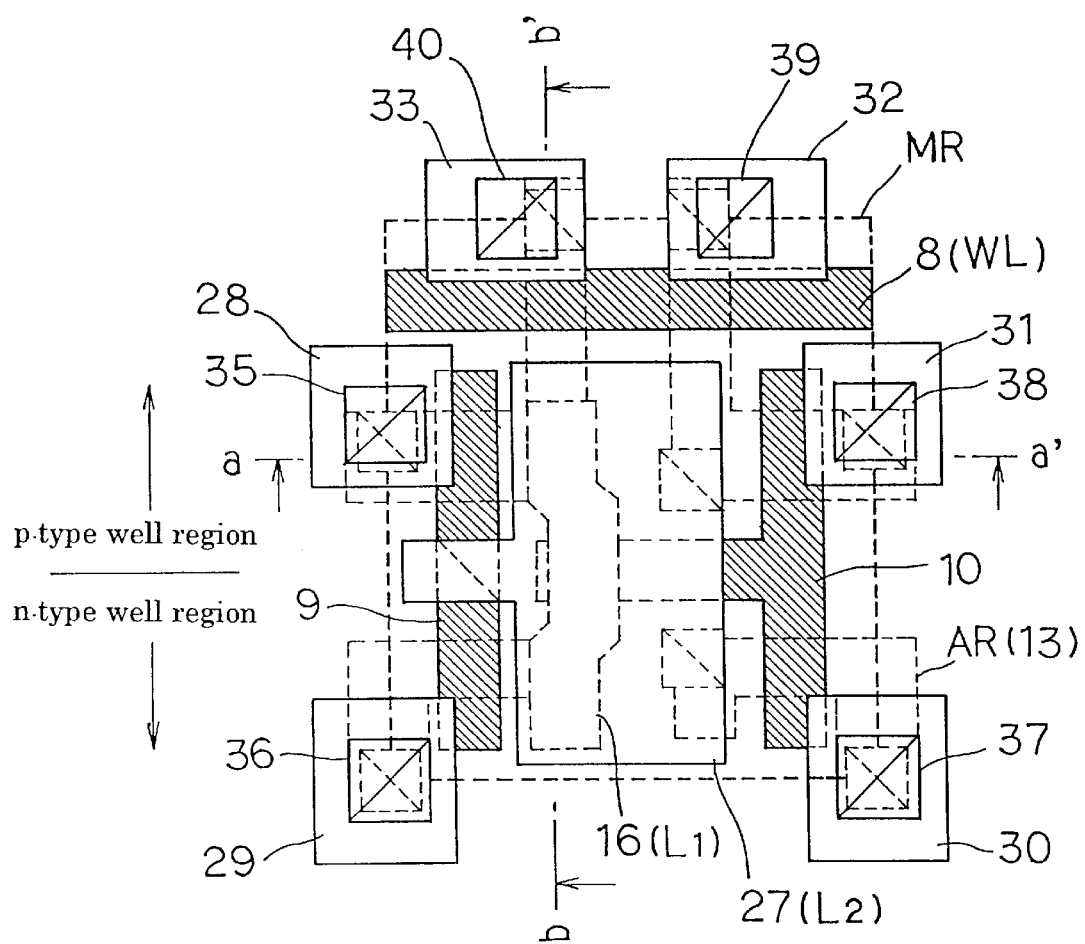
FIG. 22 is a plan view in explaining a manufacturing method of a SRAM cell in a semiconductor memory device according to the present invention.
Figure 23:
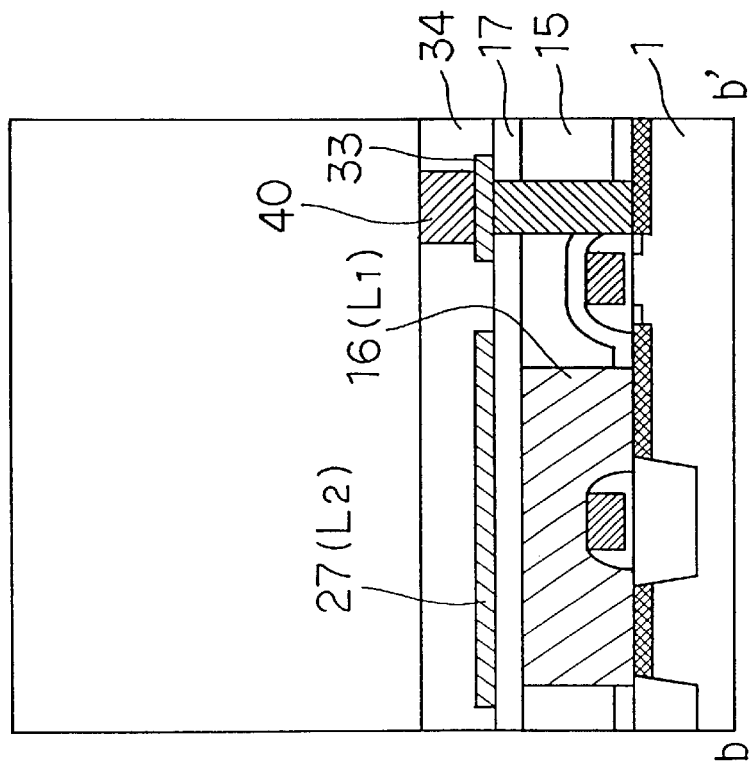
FIGS. 23(a) and 23(b) are cross-sectional views in explaining a manufacturing method of a SRAM cell in a semiconductor memory device according to the present invention.
Figure 23:
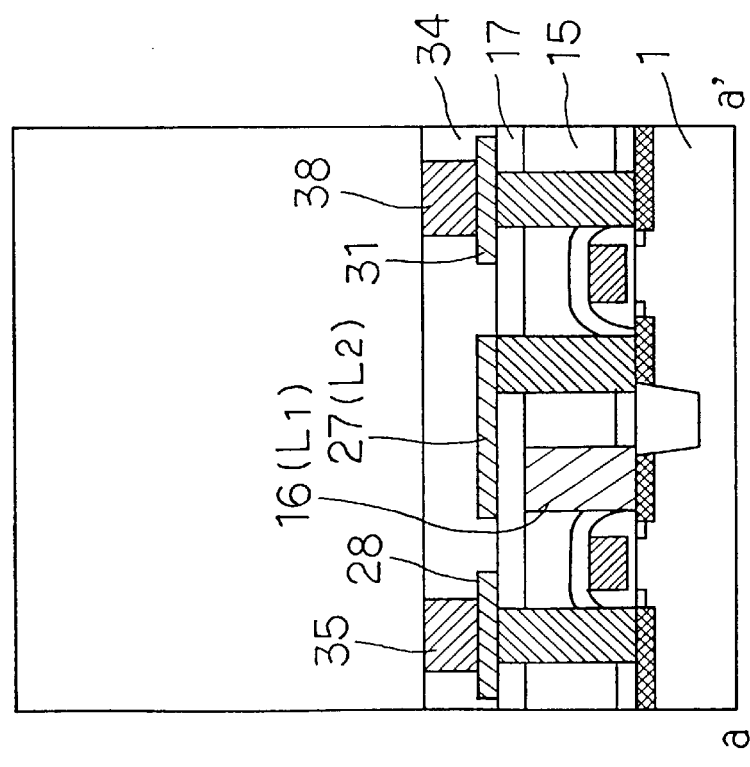

Next, after a third interlayer insulating film 34 is formed from a silicon oxide film or the like by the CVD method, by applying dry etching thereto with a photoresist used as a mask, via holes to reach respective conductive film patterns 28–33 are formed. A barrier metal film is then formed on the substrate surface including the inside of via holes, and thereafter a conductive metal film is formed from W or the like by the CVD method or such so as to fill up these via holes, and by applying the CMP to these metal films, the conductive metal film and the barrier metal film lying in regions other than the inside of the via holes are removed, whereby via plugs 35–40 reaching respective conductive film patterns 28–33 are formed, as shown in FIG. 22 and FIGS. 23(a) and 23(b).

Next, on the third interlayer insulating film 34, a supply voltage line 41 for applying a supply voltage $V_{cc}$ and a reference voltage line 42 for applying a reference voltage $V_{ss}$ are formed, as shown in FIG. 5 and FIGS. 6(a) and 6(b). These interconnections can be formed by forming an aluminium film on the third interlayer insulating film 34 by the sputtering method or such, and thereafter applying dry etching thereto, with a photoresist used as a mask, to pattern the aluminium film. Thereat, instead of the aluminium film, there may be set a layered film for which layers of a barrier metal film (TiN film or the like), an aluminium film and an anti-reflection coating film (TiN film or the like) are laid in succession. The supply voltage line 41 is in contact with via plugs 36 and 37 and electrically connected to the source regions of the load transistors $P_1$ and $P_2$, respectively. The reference voltage line 42 is in contact with via plugs 35 and 38 and electrically connected to the source regions of the driver transistors $D_1$ and $D_2$, respectively.

When patterning to form the supply voltage line 41 and the reference voltage line 42 is carried out, on via plugs 39 and 40, rectangular conductive film patterns 43 and 44 that are in contact therewith and covering the top surface thereof are concurrently formed respectively, in order to facilitate the connection between respective via plugs 39 and 40 connected to one side of the source/drain regions of the transmission transistors and the corresponding via plugs connected to bit lines $BL_1$ and $BL_2$ that are to be formed later, respectively.

Next, on the third interlayer insulating film 34 on which the supply voltage line 41, the reference voltage line 42 or the like are formed, a fourth interlayer insulating film is formed from silicon oxide or the like by the CVD method. Dry etching is then applied thereto with a photoresist used as a mask, which forms via holes to reach conductive film patterns 43 and 44 which are formed on contact plugs 39 and 40, respectively. Subsequently, after a barrier metal film is formed on the fourth interlayer insulating film including the inside of these via holes, a conductive metal film is formed by the CVD method from W or the like so as to fill up these via holes. The CMP is then performed to remove these metal films lying in regions other than the insides of via holes, and thereby formation of via plugs are accomplished.

Next, on the fourth interlayer insulating film in which these via plugs are formed, bit lines $BL_1$ and $BL_2$ are formed. These bit lines can be formed by forming an aluminium film on the fourth interlayer insulating film by the sputtering method or such, and thereafter applying dry etching thereto, with a photoresist used as a mask, to pattern the aluminium film. Thereat, instead of the aluminium film, there may be set a layered film for which layers of a barrier metal film (TiN film or the like), an aluminium film and an anti-reflection coating film (TiN film or the like) are laid in succession. The bit lines are in contact with one of via plugs formed in the fourth interlayer insulating film, respectively, and are electrically connected to one side of the source/drain regions of one of the transmission transistors $T_1$ and $T_2$.

Through the steps described above, fabrication of a memory cell of the present embodiment is accomplished. After this, prescribed steps, for example, of forming a passivation film on the fourth interlayer insulating film on which bit lines are formed, may be performed appropriately.

What is claimed is:

1. A semiconductor device having:
    a gate electrode which is formed on a first conductive-type well set in a semiconductor substrate, with a gate insulating film lying therebetween;
    a Lightly Doped Drain- (LDD) structure in which, on either side of said gate electrode, there is formed a LDD region which is a second conductive-type dopant diffusion region with a low dopant concentration and a source/drain region which is a second conductive-type dopant diffusion region with a high dopant concentration;
    an interlayer insulating film to cover said gate electrode as well as said section of LDD structure; and
    contact sections which are formed by filling up openings made in said interlayer insulating film with a conductive metal; wherein:
        a contact section connecting to the source/drain regions on one side of the gate electrode and having a potential equal to a potential of said first conductive-type well is disposed so as to come into contact with the LDD region lying on said one side of the gate electrode; and
        a contact section connecting to the other side of the source/drain regions on the other side of the gate electrode and having a potential different from the potential of said first conductive-type well is disposed so as not to come into contact with the LDD region lying on said one side of the gate electrode.

2. A semiconductor device according to claim 1, wherein, at least, a bottom section of each contact section is composed of titanium or a titanium-containing material.

3. A semiconductor device according to claim 1, wherein boron is utilized as second conductive-type dopants.

4. A semiconductor device having a Static Random Access Memory (SRAM) in which a memory cell comprises a pair of transmission transistors and a flip-flop circuit containing a pair of driver transistors and a pair of load transistors; wherein:
    each one of said load transistors has:
        a gate electrode formed on a semiconductor substrate, with a gate insulating film lying therebetween; and
        a Lightly Doped Drain (LDD) structure in which, on either side of said gate electrode, there is formed a LDD region which a dopant diffusion region with a low dopant concentration and an adjacent source/drain region which is a dopant diffusion region with a high dopant concentration; and, therein,
        a contact section connecting to the source region is disposed so as to make a distance therefrom to the gate electrode in the direction of the gate length smaller than a width of the LDD region lying between the gate electrode and the source region in the direction of the gate length; and
        a contact section connecting to the drain region is disposed so as not to come into contact with the LDD region adjacent the drain region.

5. A semiconductor device according to claim 4, wherein each one of said transmission transistors has:
    a gate electrode formed on a semiconductor substrate, with a gate insulating film lying therebetween; and
    a LDD structure in which, on either side of said gate electrode, there is formed a LDD region which is a dopant diffusion region with a low dopant concentration and an adjacent source/drain region which is a dopant diffusion region with a high dopant concentration; and, therein,
    a contact section connecting to the source/drain region is disposed so as not to come into contact with the LDD region lying adjacent the source/drain region.

6. A semiconductor device according to claim 4, wherein, at least, a bottom section of each contact section is composed of titanium or a titanium-containing material.

7. A semiconductor device according to claim 4, wherein said contact sections are formed by forming a titanium-containing barrier film on the inside of contact holes and thereafter filling up the holes with a conductive material.

8. A semiconductor device according to claim 7, wherein a layered film for which a titanium film and a titanium nitride film are formed in this order is set as said titanium-containing barrier film.

9. A semiconductor device according to claim 4, wherein the dopant diffusion regions of said load transistors contain boron.

10. A semiconductor device according to claim 4, wherein a refractory metal silicide layer is formed over a surface of every source/drain region in said load transistors, driver transistors and transmission transistors.

11. A semiconductor device according to claim 4, wherein:
    a contact section connecting to a drain region of a first load transistor which is one of said pair of load transistors and a contact section connecting to a drain region of a first driver transistor which has a gate electrode formed from a first conductive film interconnection A, the gate electrode being in common to said first load transistor, are formed, as one body, to constitute an inlaid interconnection set in a first insulating film which is an interlayer insulating film, and
    said inlaid interconnection serves as one of a pair of local interconnections cross-coupling a pair of input/output terminals in said flip-flop circuit; and
    a second conductive film interconnection formed from a second conductive film which is set on said first insulating film, with a second insulating film lying therebetween, constitutes the other one of said pair of local interconnections.

12. A semiconductor device according to claim 11, wherein said second conductive film interconnection is disposed so as to overlap at least a portion of a top surface of said inlaid interconnection, with said second insulating film lying therebetween; and said inlaid interconnection and said second conductive film interconnection, separated by said second insulating film, constitute a capacitor element.

13. A semiconductor device according to claim 11; wherein said inlaid interconnection is disposed so as to make connection with said drain region of the first driver transistor which is one of said pair of driver transistors;

said drain region of the first load transistor which is one of said pair of load transistors; and a first conductive film interconnection B which constitutes a gate electrode of a second driver transistor which is the other one of the pair of driver transistors as well as a gate electrode of a second load transistor which is the other one of the pair of load transistors, and said second conductive film interconnection is connected with a contact section connecting to said first conductive film interconnection A which constitutes said gate electrode of the first driver transistor and the first load transistor;

a contact section connecting to a drain region of said second driver transistor; and a contact section connecting to a drain region of said second load transistor.

14. A semiconductor device having a Standard Random Access Memory (SRAM) in which a memory cell comprises a pair of transmission transistors and a flip-flop circuit containing a pair of driver transistors and a pair of load transistors; wherein:

every one of said load transistors and said driver transistors has:

a gate electrode formed on a semiconductor substrate, with a gate insulating film lying therebetween; and a Lightly Doped Drain (LDD) structure in which, on either side of said gate electrode, there is formed a LDD region which is a dopant diffusion region with a low dopant concentration and an adjacent source/drain region which is a dopant diffusion region with a high dopant concentration; and, therein, a contact section connecting to the source region is disposed so as to make a distance therefrom to the gate electrode in the direction of the gate length smaller than a width of the LDD region lying between the gate electrode and the source region in the direction of the gate length; and a contact section connecting to the drain region is disposed so as not to come into contact with the LDD region lying adjacent the drain region.

* * * * *